US008647813B2

(12) United States Patent
Furukawa et al.

(10) Patent No.: US 8,647,813 B2
(45) Date of Patent: Feb. 11, 2014

(54) PHOTOSENSITIVE COMPOSITION AND PHOTOSENSITIVE LITHOGRAPHIC PRINTING PLATE MATERIAL

(75) Inventors: Akira Furukawa, Tokyo (JP); Takahiro Hagihara, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 0 days.

(21) Appl. No.: 13/638,290

(22) PCT Filed: Mar. 25, 2011

(86) PCT No.: PCT/JP2011/057346
§ 371 (c)(1),
(2), (4) Date: Sep. 28, 2012

(87) PCT Pub. No.: WO2011/122473
PCT Pub. Date: Oct. 6, 2011

(65) Prior Publication Data
US 2013/0022927 A1  Jan. 24, 2013

(30) Foreign Application Priority Data

Mar. 29, 2010 (JP) .................................. 2010-074346
Feb. 10, 2011 (JP) .................................. 2011-027614

(51) Int. Cl.
G03F 7/033 (2006.01)
G03F 7/028 (2006.01)

(52) U.S. Cl.
USPC ..................... 430/281.1; 430/285.1; 430/302; 430/283.1; 430/287.1

(58) Field of Classification Search
None
See application file for complete search history.

(56) References Cited

U.S. PATENT DOCUMENTS

| 2002/0102488 | A1* | 8/2002 | Yanaka et al. ................. 430/138 |
| 2003/0190548 | A1 | 10/2003 | Furukawa et al. |
| 2006/0032390 | A1 | 2/2006 | Hoshi et al. |
| 2010/0112478 | A1 | 5/2010 | Furukawa |

FOREIGN PATENT DOCUMENTS

| EP | 1 621 341 A2 * | 2/2006 |
| GB | 2257711 A | 1/1993 |
| JP | 5-27437 A | 2/1993 |
| JP | 5-331240 A | 12/1993 |
| JP | 9-68801 A | 3/1997 |
| JP | 2002-174898 A | 6/2002 |
| JP | 2003-215801 A | 7/2003 |
| JP | 2006-103309 A | 4/2006 |
| JP | 2008-188876 A | 8/2008 |
| JP | 2008-265297 A | 11/2008 |
| JP | 2010-54878 A | 3/2010 |

* cited by examiner

Primary Examiner — Cynthia Hamilton
(74) Attorney, Agent, or Firm — Birch, Stewart, Kolasch & Birch, LLP

(57) ABSTRACT

Disclosed are a photosensitive composition containing an aqueous dispersion and having excellent storage stability, and a photosensitive lithographic printing plate material using the photosensitive composition and being capable of being developed using water, which is advantageous not only in that the photosensitive lithographic printing plate material exhibits high sensitivity and high image quality as well as excellent storage stability, but also in that even when the printing plate material is repeatedly subjected to developing treatment using water, the generation of sludge derived from the photosensitive composition in the developer repeatedly used is suppressed, achieving excellent developing properties.

A photosensitive composition containing at least an aqueous dispersion comprising an oil-in-water emulsion of a photopolymerization initiator and an oil-in-water emulsion of a compound having a polymerizable double bond group, at least one of the oil-in-water emulsion of the photopolymerization initiator and the oil-in-water emulsion of the compound having a polymerizable double bond group being an oil-in-water emulsion obtained by emulsifying and dispersing the photopolymerization initiator or the compound having a polymerizable double bond group in water in the presence of a water-soluble polymer having a sulfonate group and an anionic surfactant.

14 Claims, No Drawings

PHOTOSENSITIVE COMPOSITION AND PHOTOSENSITIVE LITHOGRAPHIC PRINTING PLATE MATERIAL

FIELD OF THE INVENTION

The present invention relates to a photosensitive composition containing an aqueous dispersion and a photosensitive lithographic printing plate material using the same and being capable of being developed using water.

BACKGROUND ART

A photosensitive composition in a liquid state containing a compound which undergoes a polymerization reaction due to, e.g., irradiation with light or ionizing radiation is used in photosensitive lithographic printing plate materials, resists for printed wiring board fabrication, the production of color filters, and the formation of fluorescent patterns. Photo-curable or ionizing radiation-curable inks for various printing methods and for ink-jet recording may be used in the liquid state as they are. Thus, there are a variety of fields to which the photosensitive composition utilizing photopolymerization can be applied, and, with respect to the use as, for example, a photoresist or a lithographic printing plate, in which an organic solvent or a strongly alkaline reagent is used in the developing treatment, recently, a system which enables a developing treatment using, e.g., water is being developed, and chemicals and apparatuses in association with the developing treatment in such a system are easy to handle and the development of this system is extremely advantageous from the viewpoint of preservation of the environment. Particularly, with respect to the lithographic printing plate, recently, a computer-to-plate (CTP) technique has been developed in which digital data produced on a computer is not output onto a film but directly output onto a printing plate, and the development of various types of plate setters having various lasers as an output device and photosensitive lithographic printing plate materials applicable to them have been vigorously made. As the CTP system is spreading, important problems to be solved and demands for the system include those related to the developing treatment. In a general CTP system, a photosensitive lithographic printing plate material is subjected to exposure with a laser, and then the non-image portion is dissolved using an alkaline developer, and subjected to washing with water and gumming steps, and the resultant material is used in printing. The alkaline developer is harmful to human body, and must be handled and stored under control with satisfactory care. Further, the purchase cost of the alkaline developer and the cost for disposal of the waste developer cause a great burden on a user, and, in addition, solution properties of the alkaline developer, such as pH and temperature, must be controlled with enormous care, making the handling of the alkaline developer extremely cumbersome.

For avoiding the use of the alkaline developer, a photosensitive composition capable of being developed using water has been proposed. For example, Japanese Unexamined Patent Publication No. Hei 5-27437 (patent document 1) discloses an aqueous photosensitive composition comprising a carboxyl group-containing resin, an amine compound, a photo-curable unsaturated compound, a photopolymerization initiator, and water. In this system, the photosensitive composition is used in the form of an aqueous solution or an aqueous dispersion as a coating fluid, and a film of the photosensitive composition is formed on a substrate and used in the state of a dry film, but the photosensitive composition is not suitable for storage for a long term, and a problem is caused in that the developing property of the composition becomes poor with the passage of time, or the photopolymerization initiator used in the composition decomposes with the passage of time, so that the sensitivity of the composition becomes poor or disappears.

Japanese Unexamined Patent Publication No. 2002-174898 (patent document 2) discloses a photosensitive composition having an urethane oligomer having a polyoxyalkylene structure dispersed in water. In this case, a film of the photosensitive composition having excellent flexibility can be obtained, but there is a problem in that with respect to the photosensitive composition which has been stored in an atmosphere at a high humidity, the film of the composition is likely to cause blocking.

Japanese Unexamined Patent Publication No. 2003-215801 (patent document 3) and Japanese Unexamined Patent Publication No. 2008-265297 (patent document 4) disclose a photosensitive composition which is capable of being developed using water and which uses as a binder polymer a cationic or anionic water-soluble polymer having a polymerizable double bond group on the side chain thereof, and a photosensitive lithographic printing plate material using the same. In this system, the problems about the storage stability caused in the above two examples are unlikely to be caused, and there can be provided a photosensitive composition which is unlikely to suffer a change in the sensitivity over a long term and to cause blocking; however, the photosensitive composition has other problems about the developing treatment stability and image quality. Specifically, with respect to the developing treatment stability, various problems arise as follows. As a developing treatment using water is continued, the generation of sludge derived from the constituents of the photosensitive composition in the developer repeatedly used is marked, and especially when using an automatic developing apparatus, a filter provided in a circulating system is clogged with the sludge in a short term during the circulation of the developer, so that the frequency of filter exchange is increased. In addition, the sludge adheres to the surface of a dry film of the photosensitive composition to cause an image defect. Further, with respect to the image quality, a problem occurs as follows. In the photosensitive composition, the compatibility between the binder polymer, which is water-soluble, and the photopolymerization initiator and other photosensitive components, which are hydrophobic, is so poor that phase separation is likely to be caused in the photosensitive composition being applied and dried. Therefore, a non-uniform film of the composition is formed, and thus uniform image quality cannot be obtained. In such a case, neither high image quality nor satisfactorily high sensitivity are achieved, and the improvement of them has been desired.

Further, with respect to the photosensitive composition described in patent documents 3 and 4, the composition in the state of a coating fluid used in the production process has poor storage stability, and the time during which the sensitivity of the composition can be maintained (pot life) is short. Specifically, in the photosensitive composition in the state of a coating fluid, a heat polymerization or photopolymerization reaction is initiated, so that the reaction consumes the photopolymerization initiator and monomers, causing a problem in that, for example, the photosensitive lithographic printing plate material formed after drying the applied composition is reduced in sensitivity.

Furthermore, as photosensitive compositions having a long pot life, Japanese Unexamined Patent Publication No. Hei 5-331240 (patent document 5) discloses a photosensitive composition of a system containing a triazine derivative, and Japanese Unexamined Patent Publication No. Hei 9-68801 (patent document 6) discloses a photosensitive composition of a system using a specific photosensitive resin. However, in these systems, it is difficult to obtain a satisfactorily high sensitivity. Further, it is well known that the addition of an antioxidant, such as a hydroquinone, improves the pot life, but, in this method, the antioxidant induces a polymerization termination reaction, making it difficult to obtain a photosensitive composition having a high sensitivity.

CITED REFERENCES

Patent Documents

Patent document 1: Japanese Unexamined Patent Publication No. Hei 5-27437
Patent document 2: Japanese Unexamined Patent Publication No. 2002-174898
Patent document 3: Japanese Unexamined Patent Publication No. 2003-215801
Patent document 4: Japanese Unexamined Patent Publication No. 2008-265297
Patent document 5: Japanese Unexamined Patent Publication No. Hei 5-331240
Patent document 6: Japanese Unexamined Patent Publication No. Hei 9-68801

DISCLOSURE OF THE INVENTION

Problems to be Solved by the Invention

An object of the present invention is to provide a photosensitive composition containing an aqueous dispersion and having excellent storage stability, and a photosensitive lithographic printing plate material using the photosensitive composition and being capable of being developed using water, which is advantageous not only in that the photosensitive lithographic printing plate material exhibits high sensitivity and high image quality as well as excellent storage stability, but also in that even when the printing plate material is repeatedly subjected to developing treatment using water (water developing treatment), the generation of sludge derived from the photosensitive composition in the developer repeatedly used is suppressed, achieving excellent developing properties.

Means to Solve the Problems

The task of the present invention is achieved by a photosensitive composition which contains at least an aqueous dispersion comprising an oil-in-water emulsion of a photopolymerization initiator and an oil-in-water emulsion of a compound having a polymerizable double bond group, wherein at least one of the oil-in-water emulsion of the photopolymerization initiator and the oil-in-water emulsion of the compound having a polymerizable double bond group is an oil-in-water emulsion obtained by emulsifying and dispersing the photopolymerization initiator or the compound having a polymerizable double bond group in water in the presence of a water-soluble polymer having a sulfonate group and an anionic surfactant, and a photosensitive lithographic printing plate material which has on a substrate a photocurable photosensitive layer formed by applying a coating fluid containing the photosensitive composition onto the substrate.

It is preferred that the oil-in-water emulsion of the photopolymerization initiator is an oil-in-water emulsion obtained by emulsifying and dispersing the photopolymerization initiator in water in the presence of a water-soluble polymer having a sulfonate group and an anionic surfactant, and the oil-in-water emulsion of the compound having a polymerizable double bond group is an oil-in-water emulsion obtained by emulsifying and dispersing the compound having a polymerizable double bond group in water in the presence of a water-soluble polymer having a sulfonate group and an anionic surfactant.

It is preferred that the oil-in-water emulsion of the photopolymerization initiator or the oil-in-water emulsion of the compound having a polymerizable double bond group is an oil-in-water emulsion obtained by emulsifying and dispersing the photopolymerization initiator or the compound having a polymerizable double bond group in water in the presence of a water-soluble polymer having a sulfonate group and an anionic surfactant as well as a polymer compound having repeating units each represented by the following general formula 1:

[Chemical formula 1]

General formula 1

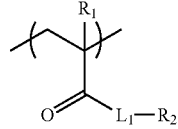

wherein, in general formula 1, $R_1$ represents a hydrogen atom or a methyl group, $L_1$ represents a linking group comprising an atom selected from the group consisting of a carbon atom, a hydrogen atom, an oxygen atom, a nitrogen atom, and a sulfur atom, and $R_2$ represents a substituent comprising repeating units selected from ethylene oxide and propylene oxide.

It is preferred that the oil-in-water emulsion of the photopolymerization initiator or the oil-in-water emulsion of the compound having a polymerizable double bond group is an oil-in-water emulsion obtained by dissolving the photopolymerization initiator or the compound having a polymerizable double bond group in a volatile organic solvent and then emulsifying and dispersing the resultant solution in water, and subsequently distilling off the volatile organic solvent, and it is more preferred that the volatile organic solvent is ethyl acetate.

Effect of the Invention

By the present invention, there are provided a photosensitive composition containing an aqueous dispersion and having excellent storage stability, and a photosensitive lithographic printing plate material using the photosensitive composition and being capable of being developed using water, which is advantageous not only in that the photosensitive lithographic printing plate material exhibits high sensitivity and high image quality as well as excellent storage stability, but also in that even when the printing plate material is repeatedly subjected to water developing treatment, the generation of sludge derived from the photosensitive composition in the developer repeatedly used is suppressed, achieving excellent developing properties.

BEST MODE FOR CARRYING OUT THE INVENTION

Hereinbelow, the present invention will be descried in detail. Explanation is first made on the oil-in-water emulsion obtained by emulsifying and dispersing the photopolymerization initiator or the compound having a polymerizable double bond group in water. It is known that a photopolymerization initiator or a compound having a polymerizable double bond group is generally a water-insoluble compound. In the present invention, basically an arbitrary water-insoluble compound can be used. In the present invention, the term "water-insoluble" means that the solubility in water at 25° C. {the amount (g) of a compound dissolved in 100 g of water} is less than 0.1. Specific examples of the photopolymerization initiators or compounds having a polymerizable double bond group, which correspond to the water-insoluble compounds, are described in detail later.

In the present invention, it is necessary that at least one of the photopolymerization initiator and the compound having a polymerizable double bond group be emulsified and dispersed in water in the presence of a water-soluble polymer having a sulfonate group and an anionic surfactant. It is preferred that both the photopolymerization initiator and the compound having a polymerizable double bond group are emulsified and dispersed in water in the presence of a water-soluble polymer having a sulfonate group and an anionic surfactant. As described below, in the process for the preparation of the oil-in-water emulsion in the present invention, an organic solvent may be used as a medium in addition to water, and therefore the medium for the oil-in-water emulsion finally obtained may contain a small amount of an organic solvent, together with water.

For emulsifying and dispersing the photopolymerization initiator or the compound having a polymerizable double bond group in water, preferred is a method in which a solution is prepared using an organic solvent capable of dissolving or dispersing therein each compound, and mixed with water and then emulsified and dispersed in the water in the presence of a water-soluble polymer having a sulfonate group and an anionic surfactant. When the compound having a polymerizable double bond group is in a liquid state and the photopolymerization initiator is soluble in the compound and a mixture of them is in a liquid state, the mixture of them can be emulsified and dispersed in water without using an organic solvent. The photopolymerization initiator and the compound having a polymerizable double bond group can be preliminarily mixed together to prepare an oil-in-water emulsion having mixed both of them, but it is preferred that the individual oil-in-water emulsions are separately prepared. When the oil-in-water emulsion of the photopolymerization, initiator and the oil-in-water emulsion of the compound having a polymerizable double bond group are separately prepared and they are mixed together to prepare a photosensitive composition, the emulsion stability of the composition can be further improved. With respect to the emulsifying and dispersing method, preferred is a method in which an oil material comprising the photopolymerization initiator or the compound having a polymerizable double bond group is dispersed in water in the form of finely divided particles by high speed stirring or shaking or under another high shear stress. As an apparatus used for the dispersion, a commercially available apparatus, such as a homomixer or a homogenizer, can be preferably utilized.

The usable organic solvent means an organic solvent which is in a liquid state at room temperature and which is capable of dissolving or dispersing therein the photopolymerization initiator or the compound having a polymerizable double bond group. As examples of the organic solvents usable in the present invention, there can be mentioned volatile organic solvents and nonvolatile organic solvents. When a volatile organic solvent is used, it is preferred that the volatile organic solvent is removed from the system by, e.g., heating or allowing the prepared oil-in-water emulsion to stand. In the case where a nonvolatile organic solvent having a flash point of higher than 50° C. is used, even when the nonvolatile organic solvent is not removed from the system, care taken for the compound as a flammable hazardous material in the general handling can be reduced.

Examples of volatile organic solvents usable in the present invention include lower alkanol acetates, such as ethyl acetate, propyl acetate, and butyl acetate; ethylene glycol acetates, such as ethylene glycol monomethyl ether acetate and ethylene glycol monoethyl ether acetate; ketones, such as methyl ethyl ketone, methyl isobutyl ketone, and cyclohexanone; hydrocarbons, such as hexane, cyclohexane, and heptane; and aromatic hydrocarbons, such as benzene, toluene, and xylene. Of these, ethyl acetate can be most preferably used for various reasons mentioned later.

Examples of nonvolatile organic solvents usable in the present invention include phosphates, phthalates, acrylates, methacrylates, other carboxylates, fatty acid amides, alkylated biphenyls, alkylated terphenyls, alkylated naphthalenes, diarylethanes, chlorinated paraffins, alcohol solvents, phenolic solvents, ether solvents, monoolefin solvents, and epoxy solvents. More specifically, examples include high boiling point solvents, such as tricresyl phosphate, trioctyl phosphate, octyldiphenyl phosphate, tricyclohexyl phosphate, dibutyl phthalate, dioctyl phthalate, dilauryl phthalate, dicyclohexyl phthalate, diethylene glycol benzoate, dioctyl cebacate, dibutyl cebacate, dioctyl adipate, trioctyl trimellitate, acetyltriethyl citrate, octyl maleate, dibutyl maleate, isoamylbiphenyl, chlorinated paraffin, diisopropylnaphthalene, 1,1'-ditolylethane, monoisopropylbiphenyl, diisopropylbiphenyl, 2,4-ditertiary-amylphenol, N,N-dibutyl-2-butoxy-5-tertiary-octylaniline, 2-ethylhexyl hydroxybenzoate, and polyethylene glycol.

The oil-in-water emulsion of the photopolymerization initiator or the oil-in-water emulsion of the compound having a polymerizable double bond group, which can preferably used in the present invention, is of a system using a volatile organic solvent. In this case, the oil-in-water emulsion can be most stably prepared, and the emulsified and dispersed state of the emulsion can be advantageously kept stable even when exposed to a temperature higher than room temperature. With respect to the volatile organic solvent, ethyl acetate is especially preferred. Ethyl acetate is extremely preferred because ethyl acetate having high volatility can be easily distilled off from the oil-in-water emulsion merely by heating the emulsion or placing the emulsion under a reduced pressure, and the oil-in-water emulsion obtained after distilling off ethyl acetate is in a solid dispersed state, forming a further more stable photosensitive composition than that obtained from the oil-in-water emulsion containing an organic solvent, such as ethyl acetate.

A method for preparing the oil-in-water emulsion having dispersed therein the photopolymerization initiator or compound having a polymerizable double bond group in the present invention is described below in detail. Using an organic solvent, e.g., ethyl acetate as mentioned above, a solution having dissolved or dispersed therein the below-mentioned photopolymerization initiator or compound having a polymerizable double bond group is prepared. When adding the prepared solution to water containing a water-soluble compound, such as a water-soluble polymer having a sulfonate group and an anionic surfactant, the resultant mixture is emulsified and dispersed using a known stirring apparatus capable of exhibiting high speed shear, such as a homomixer or a homogenizer, to prepare an oil-in-water emulsion f the photopolymerization initiator or an oil-in-water emulsion of the compound having a polymerizable double bond group. Another water-insoluble compound contained in the photosensitive composition of the present invention may be added to the organic solvent, and another water-soluble compound contained in the photosensitive composition of the present invention may be added to water used as a dispersion medium. The photosensitive composition of the present invention contains an aqueous dispersion, and therefore the water-soluble compound may be added to the composition later. Basically the finally obtained photosensitive composition similarly exhibits excellent properties even when the above-mentioned combination and order of addition of the components are not employed and the individual components are used in any combination and added in any order as long as at least one of the photopolymerization initiator and the compound having a polymerizable double bond group is emulsified and dispersed in the presence of a water-soluble polymer having a sulfonate group and an anionic surfactant. When both the water-soluble polymer having a sulfonate group and the anionic surfactant are not used and one of the photopolymerization initiator and the compound having a polymerizable double bond group is emulsified and dispersed, it is difficult to obtain a stable emulsified and dispersed state. Therefore, in such a case, it is preferred to use an anionic surfactant as a dispersing auxiliary. Further, in any case, the emulsifying and dispersing method may be conducted in a batchwise manner, or can be conducted in a continuous manner in which the mixture flowing through a piping system is continuously emulsified and dispersed. The emulsifying and dispersing operation is preferably conducted at a temperature in the range of from 0 to 70° C.

When a volatile organic solvent is used in the above-dispersed emulsion of the photopolymerization initiator or emulsion of the compound having a polymerizable double bond group, the volatile organic solvent can be distilled off and removed from the emulsion by further heating the emulsion.

In the above step for distilling off the solvent, the volatile organic solvent may be distilled off by heating, but it is further preferred that the organic solvent is distilled off under a reduced pressure. When the photopolymerization initiator usable in the present invention is heated for a long time, the initiator is generally likely to decompose, and hence, when heating is conducted in distilling off the solvent, it is preferred that the heating is conducted at a temperature of 70° C. or lower for a period of time as short as several hours or less. Accordingly, when ethyl acetate is used as the volatile organic solvent, the organic solvent can be distilled off at a temperature of 70° C. or lower, and further can be extremely advantageously distilled off at a lower temperature under a reduced pressure. With respect to the reduced pressure conditions, it is preferred that the volatile organic solvent is distilled off under a pressure corresponding to 70 to 5% of atmospheric pressure as a standard. It is preferred that the distilled organic solvent is cooled and recovered in another container. In this case, by measuring the amount of the recovered organic solvent, the amount of the volatile organic solvent in the oil-in-water emulsion can be determined.

Next, the photopolymerization initiator used in the present invention is described below. Examples of photopolymerization initiators usable in the present invention include (a) aromatic ketones, (b) aromatic onium salt compounds, (c) organic peroxides, (d) hexaarylbiimidazole compounds, (e) ketoxime ester compounds, (f) azinium compounds, (g) active ester compounds, (h) metallocene compounds, (i) trihaloalkyl-substituted compounds, and (j) organoboron compounds.

Preferred examples of aromatic ketones (a) include compounds having a benzophenone skeleton or a thioxanthone skeleton described in "RADIATION CURING IN POLYMER SCIENCE AND TECHNOLOGY" J. P. FOUASSIER, J. F. RABEK (1993), p. 77 to 177, α-thiobenzophenone compounds described in Examined Japanese Patent Application Publication No. Sho 47-6416, benzoin ether compounds described in Examined Japanese Patent Application Publication No. Sho 47-3981, α-substituted benzoin compounds described in Examined Japanese Patent Application Publication No. Sho 47-22326, benzoin derivatives described in Examined Japanese Patent Application Publication No. Sho 47-23664, aroylphosphonic esters described in Japanese Unexamined Patent Publication No. Sho 57-30704, diallcoxybenzophenones described in Examined Japanese Patent Application Publication No. Sho 60-26483, benzoin ethers described in Examined Japanese Patent Application Publication No. Sho 60-26403 and Japanese Unexamined Patent Publication No. Sho 62-81345, p-di(dimethylaminobenzoyl)benzene described in Japanese Unexamined Patent Publication No. Hei 2-211452, thio-substituted aromatic ketones described in Japanese Unexamined Patent Publication No. Sho 61-194062, acylphosphine sulfide described in Examined Japanese Patent Application Publication No. Hei 2-9597, acylphosphines described in Examined Japanese Patent Application Publication No. Hei 2-9596, thioxanthones described in Examined Japanese Patent Application Publication No. Sho 63-61950, and coumarins described in Examined Japanese Patent Application Publication No. Sho 59-42684.

Examples of aromatic onium salts (b) include aromatic onium salts of N, P, As, Sb, Bi, O, S, Se, Te, or I. As examples of the aromatic onium salts, there can be mentioned compounds described in, e.g., Examined Japanese Patent Application Publication Nos. Sho 52-14277, Sho 52-14278, and Sho 52-14279.

Examples of organic peroxides (c) include almost all organic compounds having one or more oxygen-oxygen bonds in their molecules, and, for example, preferred are peroxide esters, such as 3,3',4,4'-tetra(tert-butylperoxycarbonyl)benzophenone and di-tert-butyl diperoxyisophthalate.

Examples of hexaarylbiimidazoles (d) include lophine dimers described in, e.g., Examined Japanese Patent Application Publication Nos. Sho 45-37377 and Sho 44-86516.

Examples of ketoxime esters (e) include 3-benzoyloxyiminobutan-2-one, 3-acetoxyiminobutan-2-one, and 3-propionyloxyiminobutan-2-one.

Examples of azinium salt compounds (f) include a group of compounds having an N-0 bond described in, e.g., Japanese Unexamined Patent Publication Nos. Sho 63-138345, Sho 63-142345, Sho 63-142346, and Sho 63-143537 and Examined Japanese Patent Application Publication No. Sho 46-42363.

Examples of active ester compounds (g) include imidosulfonate compounds described in, e.g., Examined Japanese Patent Application Publication No. Sho 62-6223, and active sulfonates described in, e.g., Examined Japanese Patent Application Publication No. Sho 63-14340 and Japanese Unexamined Patent Publication No. Sho 59-174831.

Examples of metallocene compounds (h) include titanocene compounds described in, e.g., Japanese Unexamined Patent Publication Nos. Sho 59-152396, Sho 61-151197, Sho 63-41484, Hei 2-249, and Hei 2-4705, and iron-arene complexes described in, e.g., Japanese Unexamined Patent Publication Nos. Hei 1-304453 and Hei 1-152109.

Examples of trihaloalkyl-substituted compounds (i), specifically, examples of compounds having in the molecule thereof at least one trihaloalkyl group, such as a trichloromethyl group or a tribromomethyl group, include trihalomethyl-s-triazine compounds described in, e.g., U.S. Pat. Nos. 3,954,475, 3,987,037, and 4,189,323 and Japanese Unexamined Patent Publication Nos. Sho 61-151644, Sho 63-298339, Hei 4-69661, and Hei 11-153859, and 2-trihalomethyl-1,3,4-oxadiazole derivatives described in, e.g., Japanese Unexamined Patent Publication Nos. Sho 54-74728, Sho 55-77742, Sho 60-138539, Sho 61-143748, Hei 4-362644, and Hei 11-84649. Further examples include trihaloalkylsulfonyl compounds having the trihaloalkyl group bonded to an aromatic ring or a nitrogen-containing heterocycle through a sulfonyl group described in, e.g., Japanese Unexamined Patent Publication No. 2001-290271.

Examples of organoboron salt compounds (j) include organoboron ammonium compounds described in, e.g., Japanese Unexamined Patent Publication Nos. Hei 8-217813, Hei 9-106242, Hei 9-188685, Hei 9-188686, and Hei 9-188710, organoboron sulfonium compounds and organoboron oxosulfonium compounds described in, e.g., Japanese Unexamined Patent Publication Nos. Hei 6-175561, Hei 6-175564, and Hei 6-157623, organoboron iodonium compounds described in, e.g., Japanese Unexamined Patent Publication Nos. Hei 6-175553 and Hei 6-175554, organoboron phosphonium compounds described in, e.g., Japanese Unexamined Patent Publication No. Hei 9-188710, and organoboron transition metal coordinate complex compounds described in, e.g., Japanese Unexamined Patent Publication Nos. Hei 6-348011, Hei 7-128785, Hei 7-140589, Hei 7-292014, and Hei 7-306527. Further examples include cationic dyes containing an organoboron anion as a counter anion described in, e.g., Japanese Unexamined Patent Publication Nos. Sho 62-143044 and Hei 5-194619.

The above-mentioned photopolymerization initiators may be used individually or in combination of arbitrary two or more initiators. With respect to the photopolymerization initiator used in the present invention, particularly, an organoboron salt is preferably used. Further preferably, an organoboron salt and a trihaloalkyl-substituted compound (e.g., a s-triazine compound and an oxadiazole derivative as a trihaloalkyl-substituted, nitrogen-containing heterocyclic compound, or a trihaloalkylsulfonyl compound) are used in combination. One of the merits of the use of these compounds is an effect such that the resultant photosensitive composition has increased sensitivity and the photosensitive lithographic printing plate material using the photosensitive composition is improved in, e.g., sensitivity and plate wear resistance. In addition, important merits are that the photosensitive composition containing an aqueous dispersion of the present invention can be extremely stably produced. The reason for this resides in the fact that the organoboron salt and trihaloalkyl-substituted compound are easily soluble in various organic solvents, and the solution is emulsified and dispersed in water in the presence of a water-soluble polymer having a sulfonate group and an anionic surfactant to achieve a stable emulsified and dispersed state and a solid dispersed state.

An organoboron anion constituting the organoboron salt preferably used in the present invention is represented by the following general formula 2.

[Chemical formula 2]

General formula 2

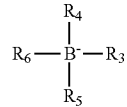

In the general formula 2, $R_3$, $R_4$, $R_5$, and $R_6$ may be the same or different, and each represents an alkyl group, an aryl group, an aralkyl group, an alkenyl group, an alkynyl group, a cycloalkyl group, or a heterocyclic ring. It is especially preferred that one of $R_3$, $R_4$, $R_5$, and $R_6$ is an alkyl group and other substituents are an aryl group.

The organoboron anion and a cation are present at the same time and form together a salt. Examples of such cations include an alkali metal ion, an onium ion, and a cationic sensitizing dye. Examples of onium salts include ammonium, sulfonium, iodonium, and phosphonium compounds, and an alkali metal ion and an onium compound are preferably used. Especially preferred examples include onium salts with an organoboron anion, e.g., ammonium salts, such as a tetraalkylammonium salt, sulfonium salts, such as a triarylsulfonium salt, and phosphonium salts, such as a triarylalkylphosphonium salt. Especially preferred examples of organoboron salts are shown below.

[Chemical formula 3]

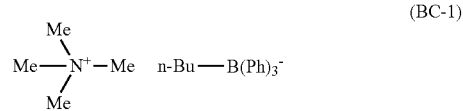
(BC-1)

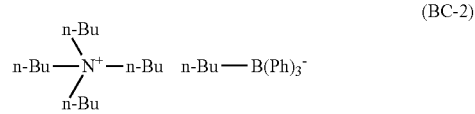
(BC-2)

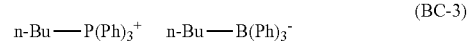
(BC-3)

(BC-4)

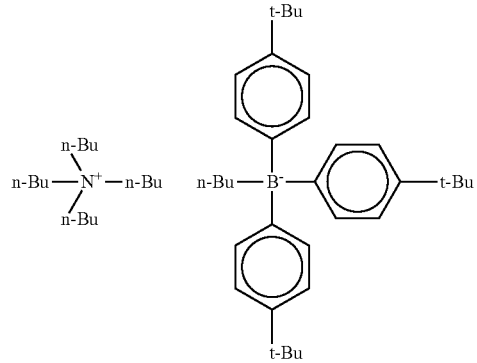

[Chemical formula 4]

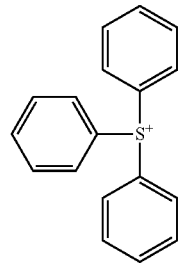 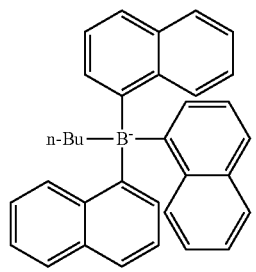
(BC-5)

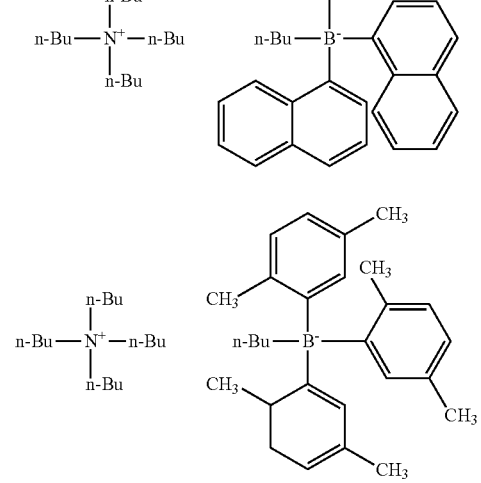
(BC-6)

(BC-7)

In the present invention, as a photopolymerization initiator which can further improve the sensitivity when used together with an organoboron salt, there can be mentioned a trihaloalkyl-substituted compound. As preferred examples of the trihaloalkyl-substituted compounds, there can be mentioned s-triazine derivatives and oxadiazole derivatives, which are, as mentioned above, compounds having a trihaloalkyl group bonded to a nitrogen-containing heterocyclic group, and trihaloalkylsulfonyl compounds having a trihaloalkyl group bonded to an aromatic ring or a nitrogen-containing heterocycle through a sulfonyl group.

Especially preferred examples of the trihaloalkyl-substituted, nitrogen-containing heterocyclic compounds and trihaloalkylsulfonyl compounds are shown below.

[Chemical formula 5]

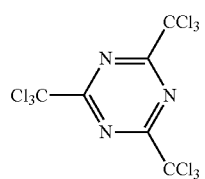
T-1

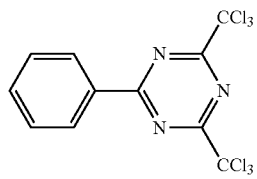
T-2

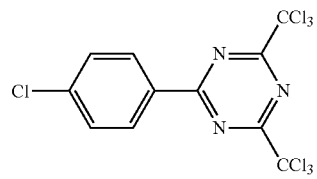
T-3

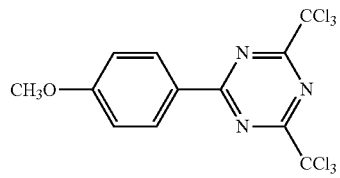
T-4

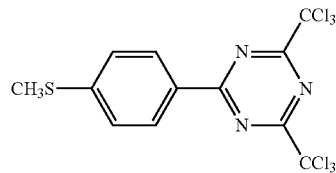
T-5

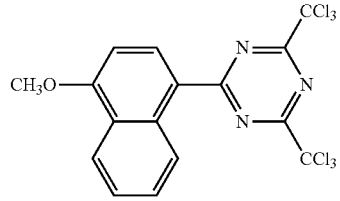
T-6

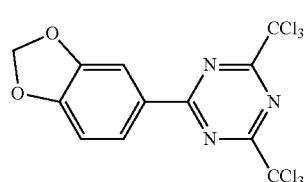
T-7

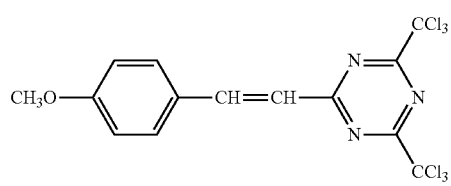
T-8

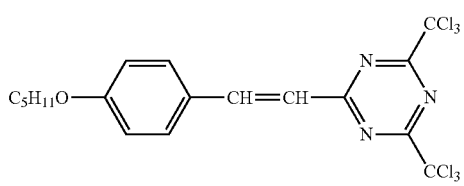
T-9

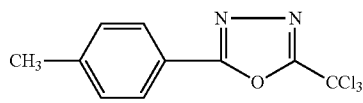
T-10

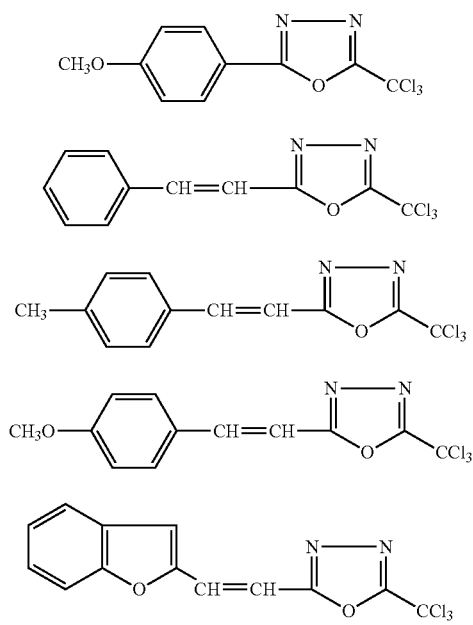

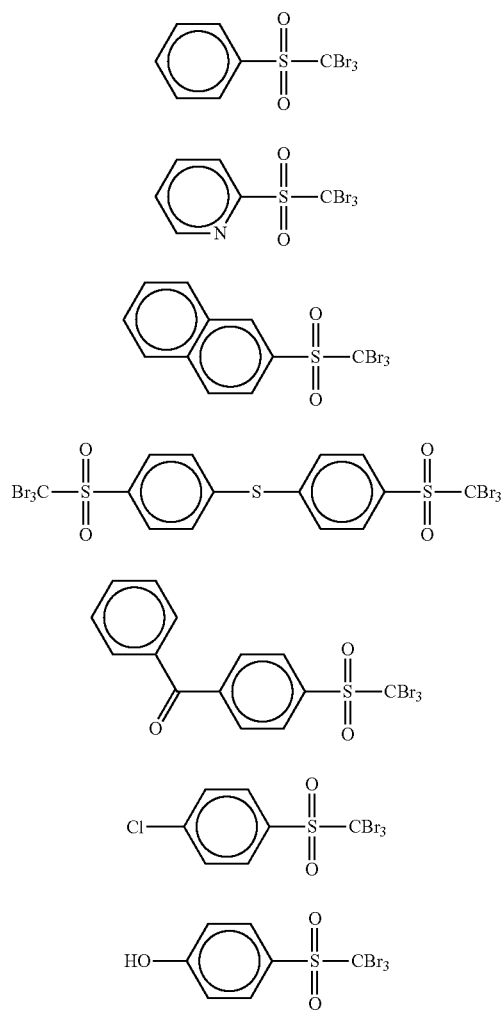

The compound having a polymerizable double bond group used in the present invention is described below. With respect to the compound having a polymerizable double bond group used in the present invention, there can be preferably used any compound which undergoes polymerization due to radicals generated by photodecomposition of the above-mentioned photopolymerization initiator. Further, when the compound having a polymerizable double bond group is used together with a compound having two or more polymerizable double bond groups in the molecule thereof, polymerization caused due to radicals forms a crosslinked material. In such a case, when constituting the below-mentioned photosensitive lithographic printing plate material, a crosslinked hard image portion film is formed, achieving a printing plate having excellent plate wear resistance and excellent ink spreadability, and therefore the above combination of the compounds can be extremely preferably used. Examples of the compounds having a polymerizable double bond group usable for the above purpose include multifunctional acrylic monomers, such as 1,4-butanediol diacrylate, 1,6-hexanediol diacrylate, neopentyl glycol diacrylate, tetraethylene glycol diacrylate, trisacryloyloxyethyl isocyanurate, tripropylene glycol diacrylate, trimethylolpropane triacrylate, pentaerythritol triacrylate, and pentaerythritol tetraacrylate. Further, various oligomers having an acryloyl group or a methacryloyl group introduced thereinto, such as polyester (meth)acrylate, urethane (meth)acrylate, and epoxy (meth)acrylate, can be similarly used.

The water-soluble polymer having a sulfonate group is described below. By emulsifying and dispersing the photopolymerization initiator or the compound having a polymerizable double bond group in water in the presence of an anionic surfactant as mentioned above, there is obtained an oil-in-water emulsion which can keep the emulsified and dispersed state stable to a certain extent even when exposed to a high temperature. In the present invention, it has been found that, by adding a water-soluble polymer having a sulfonate group to the above system, the emulsion or dispersion stability can be further improved. Specifically, by adding a water-soluble polymer having a sulfonate group when emulsifying and dispersing the photopolymerization initiator or the compound having a polymerizable double bond group, the particle size of dispersed particles in water in the oil-in-water emulsion is markedly reduced, so that the particles are dispersed in the form of extremely small droplets or finely divided particles, making it possible to prevent a problem of sedimentation or floating caused with the passage of time. Further, it is also preferably conducted that a part of the water-soluble polymer having a sulfonate group is first added when dispersing the above compound to prepare an oil-inwater emulsion, and then, to the prepared stable emulsion is added the remaining water-soluble polymer.

When the photosensitive composition of the present invention is applied onto a substrate and dried to constitute, for example, the below-mentioned photosensitive lithographic printing plate material, the water-soluble polymer having a sulfonate group functions as an excellent binder polymer to form a uniform film comprising the photopolymerization initiator and the compound having a polymerizable double bond group. Thus, there can be provided a photosensitive lithographic printing plate material which is advantageous not only in that it has excellent developing property using water and, even when the printing plate material is continuously subjected to developing treatment, the generation of sludge in the developer is suppressed, but also in that it exhibits excellent image quality and high sensitivity and is unlikely to suffer a change in the sensitivity with time.

As examples of the water-soluble polymers having a sulfonate group usable for the above purpose, there can be mentioned water-soluble polymers having a substituent in which the sulfonic acid group is in the form of a salt neutralized with an arbitrary base. In the present invention, examples of bases preferably usable for the purpose of neutralizing the sulfonic acid group include various bases, e.g., alkali metal hydroxides, such as sodium hydroxide, potassium hydroxide, and lithium hydroxide; amines, such as ammonia, triethylamine, tributylamine, monoethanolamine, diethanolamine, triethanolamine, dimethylaminoethanol, diethylaminoethanol, methylaminoethanol, ethylaminoethanol, n-butyldiethanolamine, and t-butyldiethanolamine; and quaternary ammonium bases, such as tetramethylammonium hydroxide, tetraethylammonium hydroxide, tetrapropylammonium hydroxide, tetrabutylammonium hydroxide, corrin, phenyltrimethylammonium hydroxide, and benzyltrimethylammonium hydroxide.

The water-soluble polymer having a sulfonate group most preferably usable in the present invention is a polymer obtained by polymerizing a monomer having a sulfonate group and having a structure represented by the following general formula 3.

[Chemical formula 7]

General formula 3

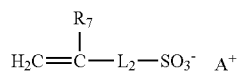

In the general formula 3, $L_2$ represents a single bond or a linking group comprising an arbitrary atom or group, specifically represents an oxygen atom, a sulfur atom, an optionally substituted linear or branched alkylene group, an arylene group, —NH—, —COO—, —CONH—, —CO—, or a group comprising an arbitrary combination thereof. $R_7$ represents a hydrogen atom or a methyl group. $A^+$ represents a cation.

Preferred examples of the monomers having a sulfonate group include alkali metal salts, amine salts, or quaternary ammonium salts of vinylsulfonic acid; alkali metal salts, amine salts, or quaternary ammonium salts of styrenesulfonic acid; alkali metal salts, amine salts, or quaternary ammonium salts of acrylamido-2-methylpropanesulfonic acid; alkali metal salts, amine salts, or quaternary ammonium salts of allylsulfonic acid; alkali metal salts, amine salts, or quaternary ammonium salts of methallylsulfonic acid; and alkali metal salts, amine salts, or quaternary ammonium salts of 3-sulfopropyl methacrylate. The alkali metal salt used in the present invention means a sodium salt, a potassium salt, or a lithium salt. The amine salt means a salt formed using an amine, such as ammonia, triethylamine, tributylamine, monoethanolamine, diethanolamine, triethanolamine, dimethylaminoethanol, diethylaminoethanol, methylaminoethanol, ethylaminoethanol, n-butyldiethanolamine, or t-butyldiethanolamine. And, the quaternary ammonium salt means a salt formed using tetramethylammonium hydroxide, tetraethylammonium hydroxide, tetrapropylammonium hydroxide, tetrabutylammonium hydroxide, corrin, phenyltrimethylammonium hydroxide, or benzyltrimethylammonium hydroxide.

As examples of the water-soluble polymers having a sulfonate group most preferably usable in the present invention, there can be mentioned polymers obtained by polymerizing the above-mentioned various monomers having a sulfonate group individually or in combination. As further preferred examples of the water-soluble polymers, there can be mentioned copolymers obtained from a combination of the above monomer having a sulfonate group and the below-shown various copolymerizable monomers.

Example of the copolymerizable monomers usable for the above purpose include styrene derivatives, such as styrene, 4-methylstyrene, 4-acetoxystyrene, and 4-methoxystyrene; various alkyl (meth)acrylates, such as methyl (meth)acrylate, ethyl (meth)acrylate, and butyl(meth)acrylate; monomers having a nitrogen-containing heterocycle, such as 4-vinylpyridine, 2-vinylpyridine, N-vinylimidazole, and N-vinylcarbazole; monomers having a quaternary ammonium salt group, such as 4-vinylbenzyltrimethylammonium chloride, acryloyloxyethyltrimethylammonium chloride, methacryloyloxyethyltrimethylammonium chloride, a quaternarization product of dimethylaminopropylacrylamide with methyl chloride, a quaternarization product of N-vinylimidazole with methyl chloride, and 4-vinylbenzylpyridinium chloride; acrylamide or methacrylamide derivatives, such as acrylamide, methacrylamide, dimethylacrylamide, diethylacrylamide, N-isopropylacrylamide, diacetone acrylamide, N-methylolacrylamide, N-methoxyethylacrylamide, and 4-hydroxyphenylacrylamide; vinyl esters, such as acrylonitrile, methacrylonitrile, phenylmaleimide, hydroxyphenylmaleimide, vinyl acetate, vinyl chloroacetate, vinyl propionate, vinyl butyrate, vinyl stearate, and vinyl benzoate; vinyl ethers, such as methyl vinyl ether and butyl vinyl ether; and other monomers, such as N-vinylpyrrolidone, acryloylmorpholine, tetrahydrofurfuryl methacrylate, vinyl chloride, vinylidene chloride, allyl alcohol, and vinyltrimethoxysilane, and various monomers can be appropriately used as a copolymerizable monomer. It is preferred that the proportion of the copolymerizable monomer to the whole copolymer is at the most less than 90% by mass, and that the proportion of the monomer having a sulfonate group contained in the copolymer to the copolymer is more than 10% by mass. When the copolymerizable monomer is contained, it is further preferred that the proportion of the copolymerizable monomer to the whole copolymer is at the most less than 70% by mass, and that the proportion of the monomer having a sulfonate group to the copolymer is more than 30% by mass. In this case, the solubility of the water-soluble polymer in water is excellent.

When the water-soluble polymer having a sulfonate group used in the present invention also has a structure which is hydrophobic to some extent, the photosensitive lithographic printing plate material comprising such a water-soluble polymer is advantageously improved in ink spreadability. Examples of copolymerizable monomers for causing the water-soluble polymer having a sulfonate group to have a hydrophobic structure include styrene, and various (meth) acrylates, such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth) acrylate, n-hexyl (meth)acrylate, c-hexyl (meth)acrylate, 2-ethylhexyl (meth)acrylate, and benzyl (meth)acrylate. In the present invention, these monomers are extremely preferably used.

Examples of the water-soluble polymers having a sulfonate group preferably usable in the present invention are shown below. The figures shown in the formulae indicate a copolymerization ratio (mass ratio).

[Chemical formula 8]

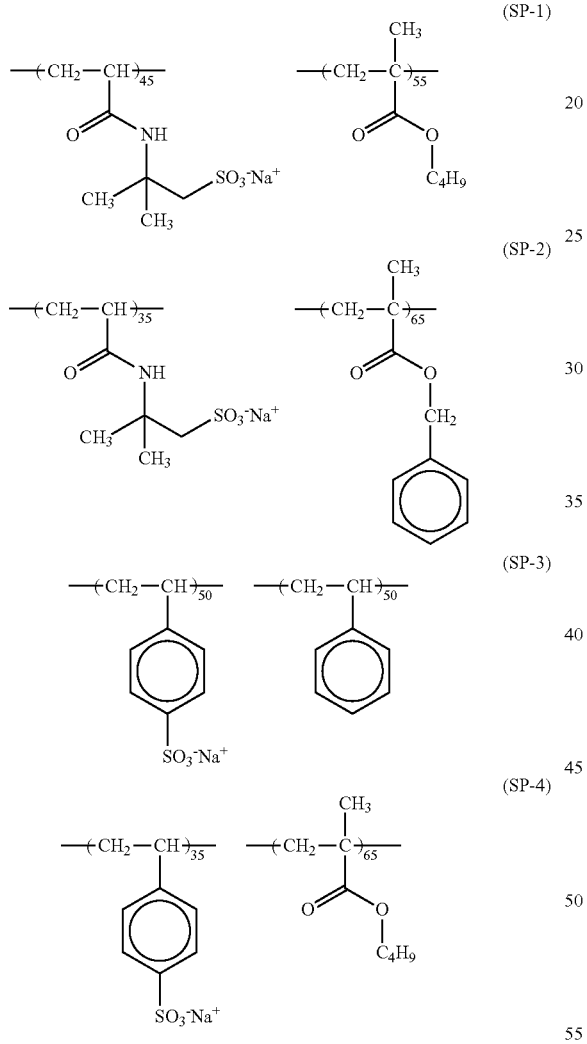

As further preferred examples of the water-soluble polymers having a sulfonate group, there can be mentioned those polymers also having a polymerizable double bond group on the side chain thereof. In this case, the photosensitive lithographic printing plate material comprising such a water-soluble polymer can be extremely preferably used because a photopolymerization efficiently proceeds in the image portion (exposed portion) of the material to form a crosslinked structure, providing a printing plate having extremely excellent plate wear resistance. With respect to the proportion of the polymerizable double bond group introduced into the side chain to the water-soluble polymer, the polymerizable double bond group can be introduced in an arbitrary proportion as long as the proportion of the monomer having a sulfonate group to the water-soluble polymer is in the range of 10% by mass or more. When the proportion of the monomer having a sulfonate group to the water-soluble polymer is 30% by mass or more, the solubility of the water-soluble polymer in water is advantageously excellent.

Examples of the water-soluble polymers having a sulfonate group and having on the side chain thereof a polymerizable double bond group preferably usable in the present invention are shown below. The figures shown in the formulae indicate a copolymerization ratio (mass ratio).

[Chemical formula 9]

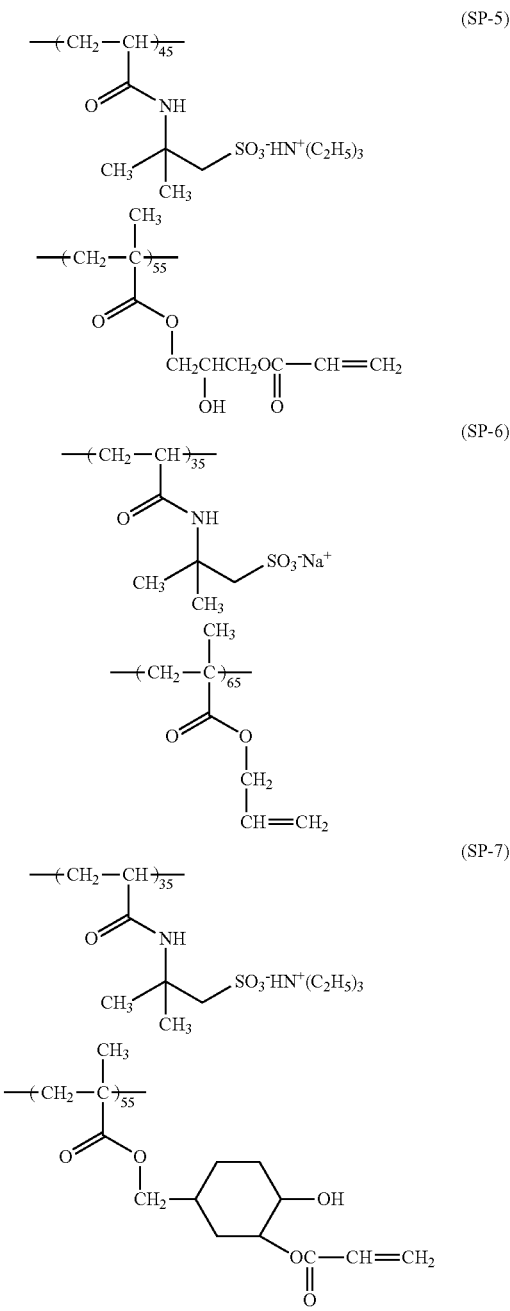

(SP-8)

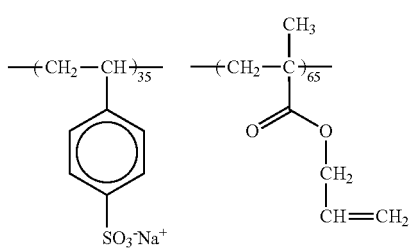

As most preferred examples of the water-soluble polymers having a sulfonate group and having on the side chain thereof a polymerizable double bond group, there can be mentioned polymers having on the side chain thereof both a sulfonate group and a phenyl group having bonded thereto a vinyl group through a heterocycle, which are described in, for example, Japanese Unexamined Patent Publication No. 2008-265297. Such most preferred examples of the water-soluble polymers are shown below. The figures shown in the formulae indicate a copolymerization ratio (mass ratio).

[Chemical formula 10]

(SP-9)

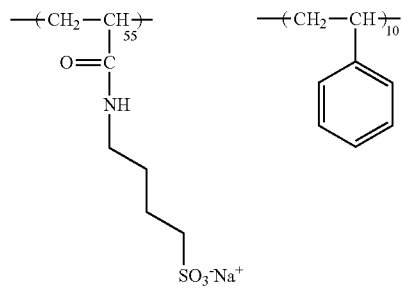

(SP-10)

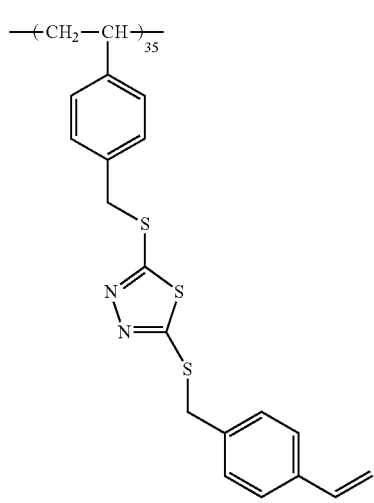

(SP-11)

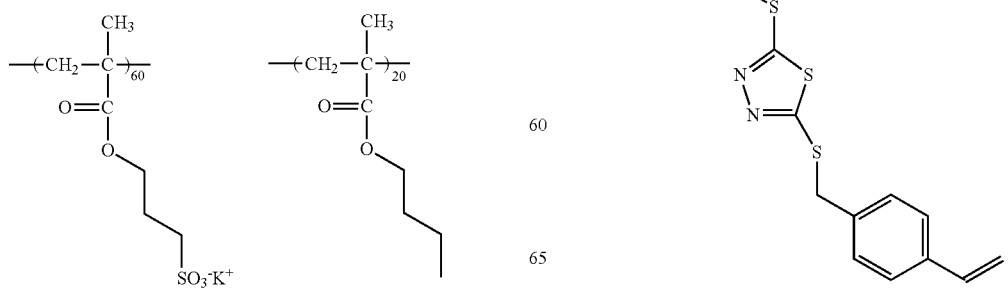

-continued
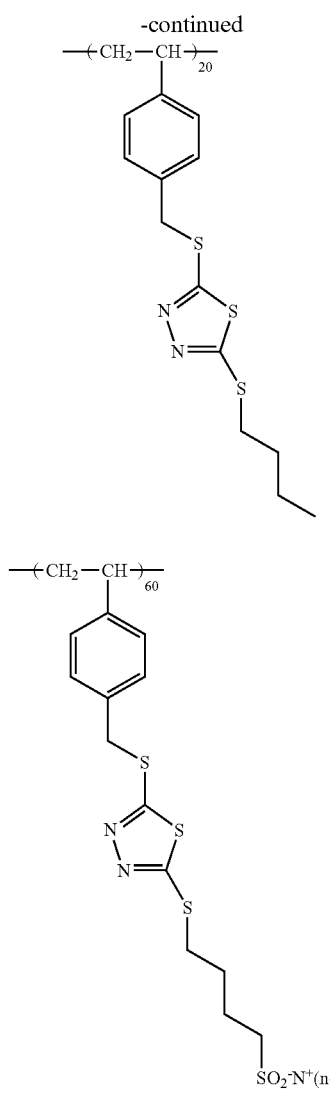
[Chemical formula 11]
(SP-12)
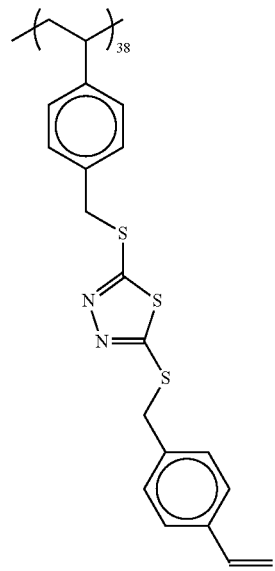
-continued
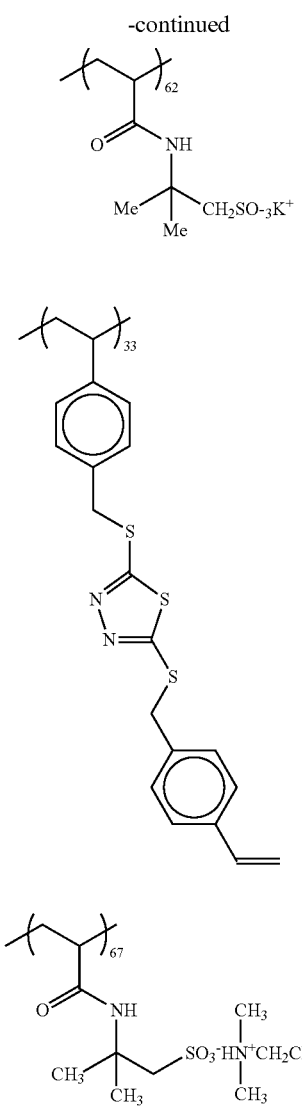
(SP-13)
(SP-14)
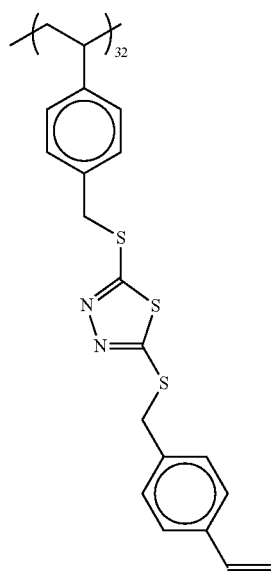

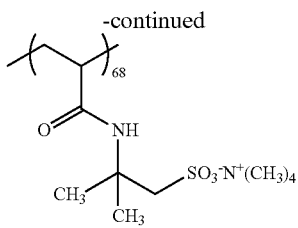

With respect to the ratio between the water-soluble polymer and the photopolymerization initiator in the oil-in-water emulsion of the photopolymerization initiator, the amount of the photopolymerization initiator is preferably in the range of from 1 to 50 parts by mass, further preferably in the range of from 3 to 40 parts by mass, relative to 100 parts by mass of the water-soluble polymer. On the other hand, with respect to the ratio between the water-soluble polymer and the compound having a polymerizable double bond group in the oil-in-water emulsion of the compound having a polymerizable double bond group, the amount of the compound having a polymerizable double bond group is preferably in the range of from 10 to 100 parts by mass, further preferably in the range of from 20 to 60 parts by mass, relative to 100 parts by mass of the water-soluble polymer. With respect to the ratio between the photopolymerization initiator and the compound having a polymerizable double bond group in the photosensitive composition, the amount of the photopolymerization initiator is preferably in the range of from 10 to 150 parts by mass, further preferably in the range of from 20 to 100 parts by mass, relative to 100 parts by mass of the compound having a polymerizable double bond group.

Next, the anionic surfactant is described. In the present invention, with respect to the anionic surfactant added together with the water-soluble polymer having a sulfonate group when emulsifying and dispersing the photopolymerization initiator or the compound having a polymerizable double bond group, examples include higher fatty acid salts, such as sodium laurate, sodium stearate, and sodium oleate; alkylsulfates, such as dioctyl sodium sulfosuccinate, sodium lauryl sulfate, and sodium stearyl sulfate; higher alcohol sulfate ester salts, such as octyl alcohol sodium sulfate, lauryl alcohol sodium sulfate, and lauryl alcohol ammonium sulfate; aliphatic alcohol sulfate ester salts, such as acetyl alcohol sodium sulfate; alkylbenzenesulfonates, such as sodium dodecylbenzenesulfonate; alkylnaphthalenesulfonates, such as sodium butylnaphthalenesulfonate and sodium isopropylnaphthalenesulfonate; alkyl diphenyl ether disulfonates, such as alkyl diphenyl ether sodium disulfonate; alkylphosphates, such as sodium laurylphosphate and sodium stearylphosphate; polyethylene oxide adducts of an alkyl ether sulfate, such as a polyethylene oxide adduct of lauryl ether sodium sulfate, a polyethylene oxide adduct of lauryl ether ammonium sulfate, and a polyethylene oxide adduct of lauryl ether triethanolamine sulfate; polyethylene oxide adducts of an alkyl phenyl ether sulfate, such as a polyethylene oxide adduct of nonyl phenyl ether sodium sulfate; polyethylene oxide adducts of an alkyl ether phosphate, such as a polyethylene oxide adduct of lauryl ether sodium phosphate; and polyethylene oxide adducts of an alkyl phenyl ether phosphate, such as a polyethylene oxide adduct of nonyl phenyl ether sodium phosphate. Of these, especially extremely preferred are dioctyl sodium sulfosuccinate, alkylnaphthalenesulfonates, and polyethylene oxide adducts of an alkyl ether sulfate because the most stable oil-in-water emulsion can be formed.

With respect to the amount of the anionic surfactant used in the present invention in the oil-in-water emulsion, when an organic solvent, such as ethyl acetate, is used, the amount of the anionic surfactant contained in the oil-in-water emulsion containing the solvent which is not distilled off is preferably in the range of from 0.5 to 50 parts by mass, relative to 100 parts by mass of the oil-in-water emulsion of the photopolymerization initiator or the oil-in-water emulsion of the compound having a polymerizable double bond group.

In the present invention, it is preferred that when the photopolymerization initiator or the compound having a polymerizable double bond group is emulsified and dispersed in water, a polymer compound having repeating units each represented by the general formula 1 above is added. The polymer compound having repeating units each represented by the general formula 1 not only serves as an effective dispersing auxiliary for stably and uniformly emulsifying and dispersing the photopolymerization initiator or the compound having a polymerizable double bond group, but also enables the photosensitive composition in a liquid state containing an aqueous dispersion containing both the oil-in-water emulsion of the photopolymerization initiator and the oil-in-water emulsion of the compound having a polymerizable double bond group to have an increased time during which the sensitivity can be maintained (pot life).

In the general formula 1, the linking group represented by $L_1$ comprises an atom selected from the group consisting of a carbon atom, a hydrogen atom, an oxygen atom, a nitrogen atom, and a sulfur atom, and the total number of the atom or atoms constituting the linking group is about 1 to 50, preferably 1 to 30, more preferably 1 to 10.

Specifically, examples of the linking groups represented by $L_1$ in the general formula 1 include an oxygen atom, an alkylene group, an arylene group, and an aliphatic ring, and the linking group may have a structure comprising a plurality of the above groups bonded together through an amide linkage or an ester linkage, and each of these groups may further have a substituent. Examples of alkylene groups include an ethylene group and a propylene group, examples of arylene groups include a phenylene group and a naphthylene group, examples of aliphatic rings include aliphatic cyclic structures, such as cyclopropane, cyclopentane, cyclohexane, cycloheptane, cyclooctane, cyclodecane, dicyclohexyl, tercyclohexyl, and norbornane, and an arbitrary carbon atom in the compound constituting the cyclic structure may be replaced by one or more heteroatoms selected from a nitrogen atom, an oxygen atom, and a sulfur atom.

Examples of substituents which can be introduced to the linking group represented by $L_1$ in the general formula 1 include monovalent nonmetal atomic groups, excluding hydrogen, such as halogen atoms (—F, —Br, —Cl and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an ureido group, an alkoxycarbonylamino group, an aryloxycarbonylamino group, a formyl group, an acyl group, a carboxyl group, and conjugate base groups thereof; an alkoxycarbonyl group, an aryloxycarbonyl group, a carbamoyl group, an N-alkylcarbamoyl group, an N,N-dialkylcarbamoyl group, an N-arylcarbamoyl group, an alkylsulfinyl group, an arylsulfinyl group, an alkylsulfonyl group, an arylsulfonyl group, a sulfo group (—SO$_3$H), and conjugate base groups thereof; an alkoxysulfonyl group, an aryloxysulfonyl group, a sulfmamoyl group, an N-alkylsulfmamoyl group, an N,N-dialkylsulfinamoyl group, an N-arylsulfinamoyl group, an N,N-diarylsulfinamoyl group, a sulfamoyl group, an N-alkylsulfamoyl group, an N-arylsulfamoyl group, an N-acylsulfamoyl group, and conjugate base groups thereof; a cyano group, a nitro group, an aryl group, an alkenyl group, and an alkynyl group.

In the general formula 1, $R_2$ represents a substituent comprising two or more repeating units which are selected from ethylene oxide and propylene oxide and which are bonded to each other. The substituent may have any of a structure comprising only ethylene oxide repeating units, a structure comprising only propylene oxide repeating units, and a structure comprising both the ethylene oxide and propylene oxide repeating units. Further, the end of the repeating structure may be a hydrogen atom or may be substituted with a substituent, such as an alkyl group or an aryl group. Examples of the alkyl groups include linear alkyl groups, such as a methyl group, an ethyl group, a propyl group, and a butyl group, and branched alkyl groups, such as an isopropyl group and an isobutyl group, and examples of the aryl groups include a phenyl group and a naphthyl group.

In the general formula 1, the number of the repeating units in the structure represented by $R_2$ comprising two or more repeating units selected from ethylene oxide and propylene oxide is preferably 5 to 80, especially preferably 10 to 50. Further, the proportion of the ethylene oxide to the sum of the ethylene oxide and propylene oxide repeating units is preferably 60% or more, especially preferably 80% or more.

On the other hand, the polymer compound having repeating units each represented by the general formula 1 may have, as repeating units other than the general formula 1 in the polymer main chain, a structure derived from a polymerizable compound, e.g., acrylic acid, methacrylic acid, an acrylic acid salt, a methacrylic acid salt, an acrylate, a methacrylate, an acrylamide, a methacrylamide, a styrene, an acrylonitrile, or a methacrylonitrile.

Examples of the acrylic acid salts and methacrylic acid salts include alkali metal salts of acrylic acid or methacrylic acid neutralized with sodium hydroxide, potassium hydroxide, or lithium hydroxide; and salts of acrylic acid or methacrylic acid neutralized with ammonia, triethylamine, tributylamine, monoethanolamine, diethanolamine, triethanolamine, dimethylaminoethanol, diethylaminoethanol, methylaminoethanol, ethylaminoethanol, n-butyldiethanolamine, t-butyldiethanolamine, or a quaternary ammonium base, such as tetramethylammonium hydroxide, tetraethylammonium hydroxide, tetrapropylammonium hydroxide, tetrabutylammonium hydroxide, corrin, phenyltrimethylammonium hydroxide, or benzyltrimethylammonium hydroxide.

Examples of the (meth)acrylates include benzyl (meth)acrylate, 4-biphenyl (meth)acrylate, butyl (meth)acrylate, sec-butyl (meth)acrylate, t-butyl (meth)acrylate, 4-t-butylphenyl (meth)acrylate, 4-chlorophenyl (meth)acrylate, pentachlorophenyl (meth)acrylate, 4-cyanobenzyl (meth)acrylate, cyanomethyl (meth)acrylate, cyclohexyl (meth)acrylate, 2-ethoxyethyl (meth)acrylate, ethyl (meth)acrylate, 2-ethylhexyl (meth)acrylate, heptyl (meth)acrylate, hexyl (meth)acrylate, isobornyl (meth)acrylate, isopropyl (meth)acrylate, methyl (meth)acrylate, 3,5-dimethyladamantyl (meth)acrylate, 2-naphthyl (meth)acrylate, neopentyl (meth)acrylate, octyl (meth)acrylate, phenethyl (meth)acrylate, phenyl (meth)acrylate, propyl (meth)acrylate, tolyl (meth)acrylate, amyl (meth)acrylate, tetrahydrofurfuryl (meth)acrylate, 2-hydroxyethyl (meth)acrylate, 3-hydroxypropyl (meth)acrylate, 2-hydroxypropyl (meth)acrylate, 4-hydroxybutyl (meth)acrylate, 5-hydroxypentyl (meth)acrylate, allyl (meth)acrylate, 2-allyloxyethyl (meth)acrylate, and propargyl (meth)acrylate.

Examples of the styrenes include styrene; examples of alkylstyrenes include methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene; examples of alkoxystyrenes include methoxystyrene, 4-methoxy-3-methylstyrene, and dimethoxystyrene; and examples of halogenated styrenes include chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene.

Examples of the (meth)acrylamides include (meth)acrylamide, N-methyl(meth)acrylamide, N-isopropyl(meth)acrylamide, morpholinyl(meth)acrylamide, piperidyl(meth)acrylamide, N-t-butyl(meth)acrylamide, N-cyclohexyl(meth)acrylamide, N-phenyl(meth)acrylamide, N-naphthyl(meth)acrylamide, N-hydroxymethyl(meth)acrylamide, N-hydroxyethyl(meth)acrylamide, N-allyl(meth)acrylamide, 4-hydroxyphenyl(meth)acrylamide, 2-hydroxyphenyl(meth)acrylamide, N,N-dimethyl(meth)acrylamide, N,N-diisopropyl(meth)acrylamide, N,N-di-t-butyl(meth)acrylamide, N,N-dicyclohexyl(meth)acrylamide, N,N-phenyl(meth)acrylamide, N,N-dihydroxyethyl(meth)acrylamide, and N,N-diallyl(meth)acrylamide.

Of these, acrylic acid, methacrylic acid, an acrylic acid salt, a methacrylic acid salt, an acrylic acid salt, a methacrylic acid salt, an alkyl acrylate (wherein the alkyl group preferably has 1 to 20 carbon atoms), an alkyl methacrylate (wherein the alkyl group preferably has 1 to 20 carbon atoms), an acrylamide, styrene, or an alkylstyrene is preferably used.

The molar ratio of the structure other than the general formula 1 to the repeating units forming the main chain is preferably in the range of from 5 to 50%, especially preferably in the range of from 10 to 30%.

Specific examples of the polymer compounds having repeating units each represented by the general formula 1 are shown below, but the polymer compound having repeating units each represented by the general formula 1 is not limited to these examples. In the formulae shown below, the figures shown outside the parentheses for the units forming the main chain indicate a repeating unit molar ratio. Further, the figures shown outside the parentheses for the portion corresponding to $R_2$ in the general formula 1 indicate the number of the bonded ethylene oxide or propylene oxide units. In the oil-in-water emulsion of the photopolymerization initiator, the amount of the polymer compound having repeating units each represented by the general formula 1 is, relative to 100 parts by mass of the photopolymerization initiator, preferably in the range of from 5 to 150 parts by mass, further preferably in the range of from 20 to 100 parts by mass. In the oil-in-water emulsion of the compound having a polymerizable double bond group, the amount of the polymer compound having repeating units each represented by the general formula 1 is, relative to 100 parts by mass of the compound having a polymerizable double bond group, preferably in the range of from 5 to 100 parts by mass, further preferably in the range of from 10 to 60 parts by mass.

[Chemical formula 12]

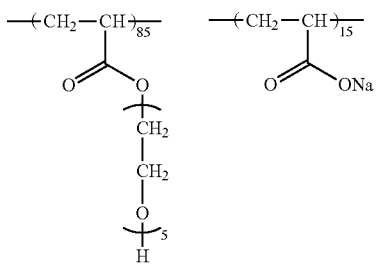
EP-1

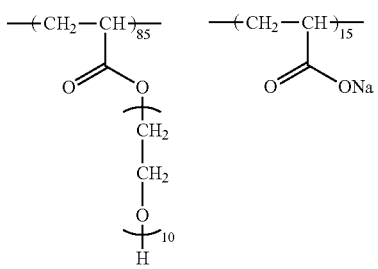
EP-2

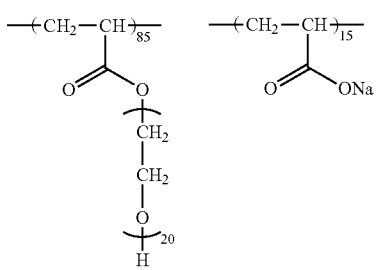
EP-3

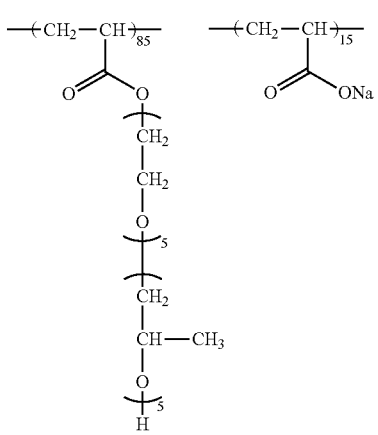
EP-6

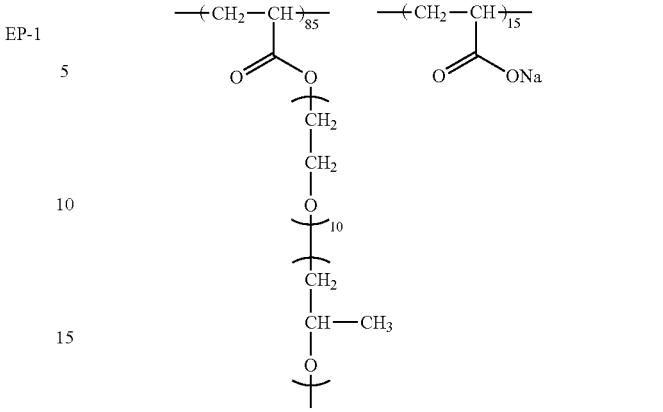
EP-7

Further, it is preferred that the photosensitive composition of the present invention further contains a sensitizing dye which is a compound for sensitizing the above-mentioned photopolymerization initiator. The amount of the sensitizing dye added is, relative to 100 parts by mass of the photopolymerization initiator, preferably in the range of from 1 to 100 parts by mass, further preferably in the range of from 10 to 50 parts by mass. Examples of the sensitizing dyes include sensitizing dyes for enhancing the sensitivity in a wavelength range of from 400 to 430 nm, such as cyanine dyes, coumarin compounds described in, e.g., Japanese Unexamined Patent Publication Nos. Hei 7-271284 and Hei 8-29973; carbazole compounds described in, e.g., Japanese Unexamined Patent Publication Nos. Hei 9-230913 and 2001-42524; carbomerocyanine dyes described in, e.g., Japanese Unexamined Patent Publication Nos. Hei 8-262715, Hei 8-272096, and Hei 9-328505; aminobenzylidene ketone dyes described in, e.g., Japanese Unexamined Patent Publication Nos. Hei 4-194857, Hei 6-295061, Hei 7-84863, Hei 8-220755, Hei 9-80750, and Hei 9-236913; pyrromethyne dyes described in, e.g., Japanese Unexamined Patent Publication Nos. Hei 4-184344, Hei 6-301208, Hei 7-225474, Hei 7-5685, Hei 7-281434, and Hei 8-6245; styryl dyes described in, e.g., Japanese Unexamined Patent Publication No. Hei 9-80751; and (thio)pyrylium compounds. Of these, a cyanine dye, a coumarin compound, or a (thio)pyrylium compound is preferred.

Examples of sensitizing dyes serving in a long wavelength range, such as a range of near infrared light, include cyanine dyes, porphyrin, spiro compounds, ferrocene, fluorene, fulgide, imidazole, perylene, phenazine, phenothiazine, polyene, azo compounds, diphenylmethane, triphenylmethane, polymethine acridine, coumarin, ketocoumarin, quinacridone, indigo, styryl, squarylium compounds, and (thio)pyrylium compounds, and further compounds described in European Patent No. 568,993 and U.S. Pat. Nos. 4,508,811 and 5,227,227 can be used.

As another element constituting the photosensitive composition of the present invention, for the purpose of enhancing the visibility of the polymerization product obtained by light irradiation or the image portion in the photosensitive lithographic printing plate material, various coloring agents are preferably added. As a coloring agent added for the above purpose, an aqueous dispersion of a coloring pigment can be most preferably used. As an example of the aqueous dispersion of a pigment, there can be used an arbitrary material having, e.g., a black, blue, red, green, or yellow pigment dispersed in water in the presence of a water-soluble dispersant. With respect to the pigment, particularly, carbon black, phthalocyanine blue, or phthalocyanine green is easily available and relatively easily dispersed in water and thus can be especially preferably used. Examples of dispersants usable for dispersing the above pigment in water include water-soluble nonionic surfactants having an oxyethylene group, such as polyethylene glycol and polypropylene glycol, and other various water-soluble polymers, such as polyacrylic acid, polyvinylpyrrolidone, a polystyrene-maleic acid half ester copolymer, and a polystyrene-maleic acid copolymer. It is preferred that the dispersant is contained in an amount in the range of from 5 to 50 parts by mass, relative to 100 parts by mass of the coloring pigment. Further, when the coloring pigment is used, it is preferred that the coloring pigment is contained in the photosensitive composition of the present invention in an amount in the range of from 1 to 30 parts by mass, relative to 100 parts by mass of the water-soluble polymer having a sulfonate group.

Further, for improving the photosensitive composition of the present invention in long-term storage stability, a polymerization inhibitor is preferably added to the composition for the purpose of preventing the occurrence of a curing reaction due to heat polymerization when stored in a dark place. With respect to the polymerization inhibitor used for the above purpose, various compounds having a phenolic hydroxyl group and quinone compounds, such as hydroquinones, catechols, naphthols, and cresols, 2,2,6,6-tetramethylpiperidin-N-oxyls, and N-nitrosophenylhydroxylamine salts are preferably used. In this case, the amount of the polymerization inhibitor added is preferably in the range of from 0.01 to 10 parts by mass, relative to 100 parts by mass of the photosensitive composition of the present invention, in term of a total solids mass.

The photosensitive lithographic printing plate, which is a preferred embodiment of the use of the photosensitive composition of the present invention, has on a substrate a photo-curable photosensitive layer formed by applying a coating fluid containing the photosensitive composition of the present invention onto the substrate. Examples of the substrates used in the photosensitive lithographic printing plate of the present invention include an aluminum substrate, various plastic films, and paper laminated with various plastics. Of these, various plastic films are a material which has flexibility and which is unlikely to deform due to a tension, and thus are preferably used. Representative preferred examples of plastic film substrates include polyethylene terephthalate, polyethylene naphthalate, polyethylene, polypropylene, polystyrene, polyvinyl acetal, polycarbonate, cellulose diacetate, cellulose triacetate, cellulose propionate, cellulose butyrate, and cellulose nitrate, and polyethylene terephthalate or polyethylene naphthalate is especially preferably used. It is preferred that the above film substrate has, on the surface thereof to which the photo-curable photosensitive layer is applied, a hydrophilic layer comprising a water-soluble polymer, colloidal silica, and a crosslinking agent, which is described in, e.g., Japanese Unexamined Patent Publication Nos. 2008-250195 and 2008-265297. Further, it is preferred that, before forming a hydrophilic layer, the surface of the film substrate is subjected to processing for rendering the surface hydrophilic (hydrophilic processing). Examples of hydrophilic processing include a corona discharge treatment, a flame treatment, a plasma treatment, and an ultraviolet light irradiation treatment. As further hydrophilic processing, for improving the adhesion of the substrate to a hydrophilic layer formed on the substrate, an undercoating layer may be formed on the substrate.

When an aluminum plate is used as a substrate, an aluminum plate having a roughened surface and having an anodic oxide film is preferably used. Further, an aluminum plate having a surface treated with silicate can be preferably used. Alternatively, an aluminum plate further having the above-mentioned hydrophilic layer formed on the surface can be used.

For producing the photosensitive lithographic printing plate material of the present invention using the above-mentioned substrate, it is necessary that a coating fluid containing the photosensitive composition of the present invention be applied onto the substrate to form a photo-curable photosensitive layer. It is preferred that the photo-curable photosensitive layer is formed on the surface of the substrate or on the surface of the substrate through the above-mentioned hydrophilic layer. In this case, the dry solids coating weight of the photo-curable photosensitive layer is preferably in the range of from 0.3 to 10 g/m$^2$, and further is extremely preferably in the range of from 0.5 to 3 g/m$^2$ for achieving excellent resolution and excellent plate wear resistance for the narrow line image and microdot image and further remarkably improving the ink spreadability. For improving properties of the photosensitive lithographic printing plate material, an arbitrary additive may be added to the coating fluid containing the photosensitive composition.

In the photosensitive lithographic printing plate material of the present invention, a protective layer is preferably further formed on the photo-curable photosensitive layer formed by applying a coating fluid containing the photosensitive composition of the present invention. The protective layer has an advantageous effect such that a low molecular weight compound, such as oxygen or a basic substance present in air, which inhibits an image forming reaction caused in the photo-curable photosensitive layer by the exposure, is prevented from mixing into the photo-curable photosensitive layer, further improving the exposure sensitivity in air. Further, the protective layer is also expected to exhibit an effect of preventing the surface of the photosensitive layer from being scratched. Therefore, the properties desired for such a protective layer are that the layer is hardly permeable to a low molecular weight compound, such as oxygen, and has excellent mechanical strength, and substantially does not inhibit the transmission of a light used in the exposure, and has excellent adhesion to the photo-curable photosensitive layer and can be easily removed in the developing step after the exposure. In the photosensitive lithographic printing plate material of the present invention, both the protective layer and the unexposed portions of the photo-curable photosensitive layer can be removed at the same time in the developing process using water, and an advantageous feature is obtained that there is no particular need to provide a step for removing the protective layer. Further, there is a problem in that the above-mentioned water-soluble polymer contained in the photo-curable photosensitive layer absorbs moisture in air to cause blocking or a change of the sensitivity during the storage, but, by forming the protective layer on the upper portion of the photo-curable photosensitive layer, the problem of blocking or change of the sensitivity can be solved. In addition, particularly, when scanning exposure is conducted using, e.g., a semiconductor laser, a photo-curable photosensitive layer having especially high sensitivity is required. In such a case, by forming the protective layer, the sensitivity is further increased, and therefore the formation of the protective layer on the photo-curable photosensitive layer can be especially preferably applied.

Studies have conventionally been made on the protective layer and are described in detail in, e.g., U.S. Pat. No. 3,458, 311 and Japanese Unexamined Patent Publication No. Sho 55-49729. As a material usable in the protective layer, for example, a water-soluble polymer compound having relatively excellent crystalline properties is preferably used, and, specifically, water-soluble polymers, such as polyvinyl alcohol, polyvinylpyrrolidone, acidic cellulose, gelatin, gum arabic, and polyacrylic acid, are known. Of these, the use of polyvinyl alcohol as a main component of the protective layer provides most advantageous results from the viewpoint of basic properties of the protective layer, such as oxygen barrier properties and removability in the development. With respect to the polyvinyl alcohol used in the protective layer, part of the polyvinyl alcohol may be substituted with an ester, an ether, or an acetal as long as the polyvinyl alcohol contains an unsubstituted vinyl alcohol unit for obtaining the required oxygen barrier properties and water-solubility. Further, part of the polyvinyl alcohol may have another copolymer component. The dry solids coating weight of the applied protective layer is preferably in the range of from 0.1 to 10 g/m$^2$, more preferably in the range of from 0.2 to 2 g/m$^2$. The protective layer is applied onto the photo-curable photosensitive layer using various known coating methods and dried.

In the photosensitive lithographic printing plate material of the present invention, when the undercoating layer, hydrophilic layer, photo-curable photosensitive layer, or protective layer is applied, a coating fluid having the composition comprising the above-mentioned elements is applied onto a substrate and dried to form a layer. As a coating method, various known methods can be used, and examples include bar coater coating, curtain coating, blade coating, air knife coating, roll coating, rotational coating, and dip coating.

For the use of a material having the photo-curable photosensitive layer formed on a substrate as mentioned above as a photosensitive lithographic printing plate material, this material is subjected to contact exposure or laser scanning exposure, so that the exposed portion of the material is crosslinked and thus reduced in the solubility in water, and the unexposed portion is dissolved in water, forming a pattern.

In the present invention, the water used in the water development has a pH in the range of 7±2, and may be pure water or pure water containing an inorganic or organic ionic compound, or may be water containing sodium, potassium, calcium, or magnesium ions. The water may contain a known surfactant and the like. The water may contain an alcohol, such as methanol, ethanol, propanol, isopropanol, ethylene glycol, propylene glycol, methoxyethanol, or polyethylene glycol. Alternatively, for protecting the plate surface from, e.g., fingerprint stains, a commercially available gum solution can be added to the water for development.

EXAMPLES

Hereinbelow, the present invention will be described in more detail with reference to the following Examples, which should not be construed as limiting the scope of the present invention. In the following Examples, "part(s)" and "%" are given by mass unless otherwise specified.

Examples 1 to 3 and Comparative Examples 1 to 4

Photosensitive Composition

<Preparation of an Oil-in-Water Emulsion>

2 Parts of an organoboron salt represented by BC-6 as a photopolymerization initiator and 1.5 part of a trihaloalkyl-substituted compound represented by T-4 were weighed, and further 6 parts of trimethylolpropane triacrylate as a compound having a polymerizable double bond group was added thereto, and to the resultant mixture was added 200 parts of ethyl acetate to dissolve the mixture in ethyl acetate. In the resultant solution was further dissolved 0.6 part of the cyanine dye shown below as a sensitizing dye.

[Chemical formula 15]

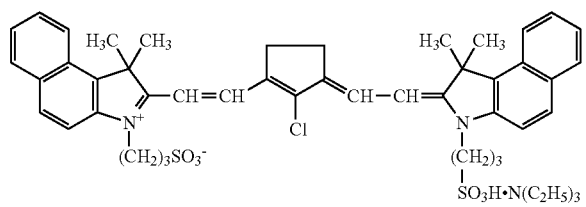

Separately, 20 parts of a water-soluble polymer and 3 parts of PELEX OT-P (dioctyl sodium sulfosuccinate; manufactured by Kao Corporation) as an anionic surfactant in the respective combination shown in Table 1 were added to and dissolved in 300 parts of ion-exchanged water.

TABLE 1

|  | Water-soluble polymer | Anionic surfactant |
|---|---|---|
| Example 1 | SP-2 | OT-P |
| Example 2 | SP-6 | OT-P |
| Example 3 | SP-13 | OT-P |
| Comparative Example 1 | None | OT-P |
| Comparative Example 2 | SP-2 | None |
| Comparative Example 3 | PA | None |
| Comparative Example 4 | PA | OT-P |

PA: Sodium polyacrylate
OT-P: PELEX OT-P, manufactured by Kao Corporation

In the preparation of the oil-in-water emulsion, there was used Desk vacuum emulsifying apparatus PVQ-1D, manufactured by Mizuho Industrial Co., Ltd., having a homomixer placed in a closed container and being capable of distilling off a solvent while heating under a reduced pressure. The rotational speed of the homomixer was set at 5,000 rpm. The above-prepared ethyl acetate solution having dissolved a photopolymerization initiator, a compound having a polymerizable double bond group, and a sensitizing dye and the above-prepared aqueous solution having dissolved a water-soluble polymer and an anionic surfactant were introduced into the vacuum emulsifying apparatus and emulsified and dispersed by high speed stirring using the homomixer at room temperature. After stirring for 10 minutes, a portion of the resultant oil-in-water emulsion was taken out as a sample, and diluted with distilled water and subjected to measurement using a particle size distribution measuring apparatus (laser diffraction/scattering type particle size distribution measuring apparatus LA-910, manufactured by Horiba, Ltd.). The results are shown in Table 2 in terms of a particle size of the oil-in-water emulsion obtained immediately after the dispersion. The oil-in-water emulsion was further stirred for 10 minutes, and then a reduced pressure state was created in the vacuum emulsifying apparatus using an aspirator, and the temperature in the apparatus was increased to 50° C. under conditions at a reduced pressure corresponding to 20% of atmospheric pressure to distill off ethyl acetate under a reduced pressure, obtaining a photosensitive composition containing an aqueous dispersion. The amount of the ethyl acetate recovered by a condenser confirmed that all the ethyl acetate used was distilled off from the dispersion system. A particle size after distilling off ethyl acetate was measured in the same manner as mentioned above, and the results are shown in Table 2.

TABLE 2

| | Particle size immediately after dispersion (μm) | Particle size after distilling off ethyl acetate (μm) |
|---|---|---|
| Example 1 | 0.4 | 0.5 |
| Example 2 | 0.3 | 0.3 |
| Example 3 | 0.15 | 0.15 |
| Comparative Example 1 | 1.5 | 5.0 |
| Comparative Example 2 | 0.5 | Coagulation |
| Comparative Example 3 | 5.0 | Coagulation |
| Comparative Example 4 | 3.0 | Coagulation |

In Examples 1 to 3, the finely divided particles comprising a photopolymerization initiator, a compound having a polymerizable double bond group, and a sensitizing dye were kept in a stable emulsified state after distilling off ethyl acetate. On the other hand, in Comparative Example 1, the average particle size of the finely divided particles was increased after distilling off ethyl acetate, and a precipitate was found on the bottom of the container in part. In Comparative Examples 2 to 4, the emulsion suffered coagulation when distilling off ethyl acetate. In Comparative Examples 1 to 4, a photosensitive composition having excellent dispersion stability was not obtained, and therefore the subsequent test was not made.

Examples 4 to 6 and Comparative Example 5

Photosensitive Lithographic Printing Plate Material

<Preparation of a Photosensitive Lithographic Printing Plate Material>

Using the photosensitive compositions obtained in Examples 1 to 3 above, a coloring agent was further added to each composition to prepare a coating fluid for producing a photosensitive lithographic printing plate material. As a coloring agent, a commercially available aqueous pigment dispersion (Himicron K Blue 7361, manufactured by Mikuni Color Ltd.) having a blue pigment dispersed in water was used. In the aqueous pigment dispersion used, a phthalocyanine pigment was dispersed using a dispersant which is a water-soluble polymer, the dispersant was added in an amount of about 20%, based on the phthalocyanine pigment, and the phthalocyanine pigment solids content was about 20%. 20 Parts of the above-mentioned Himicron K Blue was added relative to the whole amount of the photosensitive composition obtained in each of Examples 1 to 3, and the resultant mixture was stirred to prepare a blue coating fluid having the coloring agent uniformly dispersed therein.

An aluminum plate obtained by subjecting a grained, anodic oxidized aluminum plate having a thickness of 0.3 mm to silicate treatment using sodium silicate was used as a substrate. The above-obtained coating fluid was applied onto the aluminum plate using a wire bar and dried to form a photo-curable photosensitive layer, preparing photosensitive lithographic printing plate materials in Examples 4 to 6. The dry coating weight of the photo-curable photosensitive layer was 1.6 g/m$^2$. The drying was made by heating in a dryer at 80° C. for 10 minutes.

Further, using formulation 1 for comparative photosensitive composition shown below, a photosensitive composition solution for comparison was prepared. A feature of this solution is that it is a homogeneous solution of an organic solvent system containing no anionic surfactant and distilled water, differing from the photosensitive composition containing an aqueous dispersion in Example 3 above. With respect to this formulation, when Himicron K Blue which is the aqueous pigment dispersion used in Example 1 above was added, the pigment dispersion suffered coagulation and hence a coating fluid could not be prepared. For this reason, as a coloring agent, a commercially available pigment dispersion of an organic solvent system (MHI Blue #454, manufactured by Mikuni Color Ltd.) having a blue pigment dispersed in an organic solvent was used. In the pigment dispersion of an organic solvent system used, a phthalocyanine pigment was dispersed using an organic solvent-soluble dispersant, the dispersant was added in an amount of about 20%, based on the phthalocyanine pigment, and the phthalocyanine pigment solids content was about 20%. 20 Parts of the pigment dispersion was added to formulation 1 for comparative photosensitive composition shown below, and the resultant mixture was stirred to prepare a comparative coating fluid which is a blue photosensitive composition having the coloring agent uniformly dispersed therein. The obtained comparative coating fluid was applied onto the above-mentioned aluminum plate and dried to form a photo-curable photosensitive layer, preparing a photosensitive lithographic printing plate material in Comparative Example 5. The application was conducted using a wire bar so that the dry coating weight of the photo-curable photosensitive layer became 1.6 g/m$^2$. The drying was made by heating in a dryer at 80° C. for 10 minutes.

| <Formulation 1 for comparative photosensitive composition> | |
|---|---|
| Binder polymer (SP-13) | 20 Parts |
| Trimethylolpropane triacrylate | 6 Parts |
| Photopolymerization initiator (BC-6) | 2 Parts |
| Photopolymerization initiator (T-4) | 1.5 Part |
| Cyanine dye used in Example 1 | 0.6 Part |
| Ethyl acetate | 300 Parts |

<Plate Making from the Photosensitive Lithographic Printing Plate Material and Evaluation>

The photosensitive lithographic printing plate materials obtained in Examples 4 to 6 and Comparative Example 5 were individually subjected to exposure using Imagesetter for Thermal plate, PT-R4000 (imaging apparatus having a laser at 830 nm), manufactured by Dainippon Screen Mfg. Co., Ltd., so that the light exposure emitted to the plate surface became 160 mJ/cm$^2$. The exposed photosensitive lithographic printing plate material was subjected to development using ion-exchanged water containing no additive under the various conditions shown below.

<Developing Property Test>

Using the photosensitive lithographic printing plate material as exposed above, a developing property test was conducted as follows. A developing treatment was performed using Automatic developing apparatus P-1310T, manufactured by Mitsubishi Paper Mills Limited. The developing treatment was performed under two types of temperature conditions such that the developing temperature was 25° C. and 30° C. and under three types of time conditions such that the developing time was 10 seconds, 15 seconds, and 20 seconds at the respective temperatures, and the dissolving-out properties of the non-image portions were evaluated ("○" indicates that a residual film completely disappeared, "Δ"

indicates that a slight residual film was recognized, and "x" indicates that a definite residual film was caused and the dissolving-out properties were poor). The results are shown in Table 3.

TABLE 3

| | Results of evaluation of developing property Developing temperature | | | | | |
|---|---|---|---|---|---|---|
| | 25° C. | | | 30° C. | | |
| Developing time (seconds) | 10 | 15 | 20 | 10 | 15 | 20 |
| Example 4 | ○ | ○ | ○ | ○ | ○ | ○ |
| Example 5 | Δ | ○ | ○ | ○ | ○ | ○ |
| Example 6 | ○ | ○ | ○ | ○ | ○ | ○ |
| Comparative Example 5 | Δ | ○ | ○ | Δ | ○ | ○ |

<Evaluation of Resolution>

The resolution in a developing treatment conducted using the above-mentioned developer was evaluated in accordance with the following criteria: "○" indicates that 10 μm narrow lines and 1% dots were clearly reproduced; "Δ" indicates that the above lines and dots were partially missing, but 20 μm or more narrow lines and 2% or more dots were clearly reproduced; and "x" indicates that the reproducibility was lower than the above. The results are summarized in Table 4. In Comparative Example 5, the applied surface of the photo-curable photosensitive layer was not uniform and had orange peel unevenness at a pitch of about 20 μm, which adversely affected the image quality, and further the sensitivity to the light exposure was not satisfactory, resulting in poor reproducibility of narrow lines. In Examples 4 to 6, the applied surface of the photo-curable photosensitive layer was uniform and the sensitivity was high enough to give a high resolution image.

TABLE 4

| | Results of evaluation of resolution Developing temperature | | | | | |
|---|---|---|---|---|---|---|
| | 25° C. | | | 30° C. | | |
| Developing time (seconds) | 10 | 15 | 20 | 10 | 15 | 20 |
| Example 4 | Δ | Δ | Δ | Δ | Δ | Δ |
| Example 5 | ○ | ○ | Δ | ○ | ○ | Δ |
| Example 6 | ○ | ○ | ○ | ○ | ○ | ○ |
| Comparative Example 5 | x | x | Δ | x | Δ | Δ |

<Printability Test>

Among the samples obtained after the above-mentioned developing treatment, using the samples individually developed under conditions at 30° C. for 15 seconds, general offset printing was performed using Ryobi 560 as a printing machine, using an offset printing black ink as a printing ink, and using as a moisture absorbing liquid a 1% aqueous solution of moisture absorbing liquid for offset printing, Aquaunity WKK, manufactured by Toyo Ink Co., Ltd. As evaluation of the printability, a plate wear resistance was measured using a microscope (CCD Scope VC4500-PC, manufactured by Omron Corporation) with respect to 50,000 sheets of the printed material from the start of printing every 10,000 sheets. A rating "○" indicates that 20 μm narrow lines and microdot portions having a dot percentage of 2% were reproduced on the printed material, a rating "Δ" indicates that the above lines and portions were partially missing, and a rating "x" indicates that the above lines and portions were almost completely missing. With respect to the ink spreadability, a density of the printed material was measured every 10,000 sheets of the printed material using a reflection densitometer. The results are summarized in Table 5. The occurrence of scumming during the printing was not recognized in any of the tested samples. In Comparative Example 5, the image lines were not uniform, and further the unsatisfactory sensitivity to the light exposure was one cause of poor plate wear resistance.

TABLE 5

| | Start of printing | 10,000 Sheets | 20,000 Sheets | 30,000 Sheets | 40,000 Sheets | 50,000 Sheets |
|---|---|---|---|---|---|---|
| Example 4 | ○/1.5 | ○/1.3 | ○/1.2 | ○/1.0 | Δ/0.9 | Δ/0.8 |
| Example 5 | ○/1.5 | ○/1.4 | ○/1.3 | ○/1.2 | ○/1.0 | Δ/0.9 |
| Example 6 | ○/1.5 | ○/1.5 | ○/1.4 | ○/1.4 | ○/1.3 | ○/1.3 |
| Comparative Example 5 | ○/1.5 | ○/1.3 | ○/1.1 | Δ/0.8 | x/0.6 | x/0.5 |

<Water Developing Treatment Running Test>

With respect to each of the above-obtained photosensitive lithographic printing plate materials having an image made, a developing treatment was performed using, as an automatic developing apparatus, automatic developing apparatus for aluminum printing plate (PS plate), PD-912-M (manufactured by Dainippon Screen Mfg. Co., Ltd.). In a developer tank was placed ion-exchanged water adjusted to 30° C., and the developing time was set at 15 seconds. The developer tank was controlled so as to weakly rub a molton roll against the surface of the photosensitive lithographic printing plate material in the developer tank to remove the photo-curable photosensitive layer in most of the non-image portions. After the rubbing development by the molton roll, excess water in the surface of the photosensitive lithographic printing plate material was squeezed by two squeeze rolls provided at the outlet of the developer tank. In the next water washing tank, the surface of the plate material was washed by showering, and finally dried with warm air. The water developing property in this developing treatment process was evaluated in respect of four evaluation items, i.e., (A) adhesion of sludge to the squeeze rolls at the outlet of the developer tank, (B) sedimentation of sludge in the water developer tank, (C) adhesion of sludge to the surface of the treated photosensitive lithographic printing plate, and (D) formation of a developed residual film on the treated photosensitive lithographic printing plate. The evaluation was made with respect to each of the photosensitive lithographic printing plate materials in Example 6 and Comparative Example 5 by continuously passing 100 plates having an A3 size through the automatic developing apparatus. With respect to evaluation item (A), a rating "x" indicates that adhesion of sludge to the squeeze rolls at the outlet of the developer tank occurred, and a rating "○" indicates that no adhesion of sludge occurred. With respect to evaluation item (B), a rating "x" indicates that sedimentation of sludge was marked, and a rating "○" indicates that no sludge was caused and a uniformly dispersed state was maintained. With respect to evaluation item (C), a rating "x" indicates that adhesion of sludge to the 100th plate was recognized, and a rating "○" indicates that no adhesion of sludge was recognized. With respect to evaluation item (D), a rating "x" indicates that a developed residual film was recognized on the 100th plate, and a rating "○" indicates that no residual film was recognized. The results are summarized in Table 6.

TABLE 6

|  | Evaluation item (A) | Evaluation item (B) | Evaluation item (C) | Evaluation item (D) |
|---|---|---|---|---|
| Example 6 | ○ | ○ | ○ | ○ |
| Comparative Example 5 | x | x | x | x |

As seen from Table 6, with respect to the photosensitive lithographic printing plate material in Example 6, no sludge was caused and no developed residual film was recognized in the above running test. Therefore, the printability test was performed again with respect to the 100th plate, and, as a result, the printability was excellent such that no scumming occurred. With respect to the photosensitive lithographic printing plate material in Comparative Example 5, a definite developed residual film was caused in the running test, and therefore a printability test was not conducted.

<Storage Stability Test>

The photosensitive lithographic printing plate materials in Examples 4 to 6 were allowed to stand in a humidifier having a relative humidity adjusted to 85% at 35° C. for two weeks. In this instance, a polyester film having a thickness of 100 μm was placed on the surface of the photo-curable photosensitive layer of each photosensitive lithographic printing plate material and the resultant material was allowed to stand, and observed to check whether or not blocking occurred. In any of the photosensitive lithographic printing plate materials in Examples 4 to 6 removed from the humidifier, the occurrence of blocking was not recognized. Further, the resultant photosensitive lithographic printing plate materials were subjected to exposure under the above-mentioned conditions, and further subjected to developing property test, and results similar to those obtained above were obtained. The results of the evaluation of resolution were also similar to those obtained above, and thus the obtained results were excellent such that no change was found in the storage stability test.

Examples 7 to 14 and Comparative Examples 6 to 8

Photosensitive Composition and Photosensitive Lithographic Printing Plate Material <Preparation of Oil-in-Water Emulsion A>

100 Parts of ethyl acetate was added to 6 parts of trimethylolpropane triacrylate as a compound having a polymerizable double bond group to dissolve it. Separately, 150 parts of ion-exchanged water was weighed, and 20 parts of SP-2 as a water-soluble polymer having a sulfonate group was added to and dissolved in the ion-exchanged water. To the resultant solution was added the compound as shown in Table 7. As shown in Table 7, 3 parts of EP-1 was added in Examples 7 and 11, 3 parts of EP-2 was added in Example 8, and 3 parts of EP-13 was added in Example 9, wherein each of EP-1, EP-2, and EP-13 is a polymer compound having repeating units each represented by the general formula 1. In Example 10, 3 parts of EP-1 and 5 parts of PELEX OT-P as an anionic surfactant were added, and, in Example 12, 5 parts of PELEX OT-P was added. In Comparative Example 6, no dispersing auxiliary was added. In Comparative Example 7, 5 parts of sodium polyacrylate was added, and, in Comparative Example 8, 5 parts of Newcol 2302 (polyoxyethylene alkyl ether; manufactured by Nippon Nyukazai Co., Ltd.) as a nonionic surfactant was added.

TABLE 7

|  | Dispersion A | Dispersion B | Dispersion C | Dispersion D | Dispersed particle size (μm) |
|---|---|---|---|---|---|
| Example 7 | EP-1 | EP-1 |  |  | 1.6 |
| Example 8 | EP-2 | EP-2 |  |  | 1.8 |
| Example 9 | EP-13 | EP-13 |  |  | 1.5 |
| Example 10 | EP-1, OT-P | EP-1, OT-P |  |  | 1.1 |
| Example 11 | EP-1 | OT-P |  |  | 1.6 |
| Example 12 | OT-P | EP-1 |  |  | 2.2 |
| Example 13 |  |  | EP-1 | EP-1 | 1.6 |
| Example 14 |  |  | EP-1, OT-P | EP-1, OT-P | 1.1 |
| Comparative Example 6 | None | None |  |  | Coagulation |
| Comparative Example 7 | PA | PA |  |  | 2.5 |
| Comparative Example 8 | PEO | PEO |  |  | 6.4 |

OT-P: PELEX OT-P, manufactured by Kao Corporation
PA: Sodium polyacrylate
PEO: Newcol 2302, manufactured by Nippon Nyukazai Co., Ltd.

In the preparation of the oil-in-water emulsion, vacuum emulsifying apparatus PVQ-1D was used. The rotational speed of the homomixer was set at 5,000 rpm. The above-prepared ethyl acetate solution having dissolved trimethylolpropane triacrylate and the above-prepared aqueous solution having dissolved a water-soluble polymer and each dispersing auxiliary were introduced into the vacuum emulsifying apparatus and emulsified and dispersed by high speed stirring using the homomixer at room temperature for 20 minutes. Immediately after the dispersion, a portion of the resultant oil-in-water emulsion was taken out as a sample, and diluted with distilled water and a particle size of the dispersed particles in the diluted sample was measured using particle size distribution measuring apparatus LA-910, and the results are shown in Table 7. Then, a reduced pressure state was created in the vacuum emulsifying apparatus using an aspirator, and the temperature in the apparatus was increased to 50° C. under conditions at a reduced pressure corresponding to 20% of atmospheric pressure to distill off ethyl acetate under a reduced pressure. The amount of the ethyl acetate recovered by a condenser confirmed that all the ethyl acetate used was distilled off from the oil-in-water emulsion. The resultant oil-in-water emulsion of trimethylolpropane triacrylate is referred to as "oil-in-water emulsion A".

In oil-in-water emulsion A in Comparative Example 6, the average particle size of the finely divided particles was increased after distilling off ethyl acetate, and a precipitate was found on the bottom of the container. In Comparative Example 6, oil-in-water emulsion A having excellent dispersion stability was not obtained, and therefore the subsequent test was not made.

<Preparation of Oil-in-Water Emulsion B>

Next, 2 parts of an organoboron salt represented by BC-7 as a photopolymerization initiator, 1.5 part of a trihaloalkyl-substituted compound represented by T-8, and 0.6 part of the cyanine dye shown below as a sensitizing dye were weighed, and 100 parts of ethyl acetate was added thereto to dissolve them.

[Chemical Formula 16]

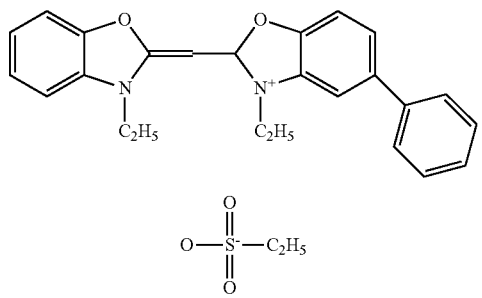

Separately, 150 parts of ion-exchanged water was weighed, and 20 parts of SP-2 as a water-soluble polymer having a sulfonate group was added to and dissolved in the ion-exchanged water. To the resultant solution was added the compound as shown in Table 7. As shown in Table 7, 3 parts of EP-1 was added in Examples 7 and 12, 3 parts of EP-2 was added in Example 8, and 3 parts of EP-13 was added in Example 9, wherein each of EP-1, EP-2, and EP-13 is a polymer compound having repeating units each represented by the general formula 1. In Example 10, 3 parts of EP-1 and 5 parts of PELEX OT-P were added, and, in Example 11, 5 parts of PELEX OT-P was added. In Comparative Example 6, no dispersing auxiliary was added. In Comparative Example 7, 5 parts of sodium polyacrylate was added, and, in Comparative Example 8, 5 parts of Newcol 2302 was added.

Using the above-mentioned vacuum emulsifying apparatus, dispersion and distillation were performed under the same conditions as those for oil-in-water emulsion A. The resultant emulsion is referred to as "oil-in-water emulsion B".

<Preparation of Oil-in-Water Emulsion C>

100 Parts of ethyl acetate was added to 6 parts of trimethylolpropane triacrylate as a compound having a polymerizable double bond group to dissolve it.

Separately, 150 parts of ion-exchanged water was weighed, and 20 parts of SP-2 as a water-soluble polymer having a sulfonate group was added to and dissolved in the ion-exchanged water. As shown in Table 7, in Example 13, 3 parts of EP-1, which is a polymer compound having repeating units each represented by the general formula 1, was added to and dissolved in the resultant solution, and, in Example 14, 3 parts of EP-1 and 5 parts of PELEX OT-P were added to and dissolved in the solution.

In the preparation of the oil-in-water emulsion, the above-mentioned vacuum emulsifying apparatus was used, and the rotational speed of the homomixer was 5,000 rpm and the dispersion time was 20 minutes, and a mixture of the above-prepared ethyl acetate solution having dissolved trimethylolpropane triacrylate and the above-prepared aqueous solution having dissolved a water-soluble polymer and others was dispersed. Immediately after the dispersion, a portion of the resultant oil-in-water emulsion was taken out as a sample and diluted with distilled water, and a particle size of the dispersed particles in the diluted sample was measured using the above-mentioned particle size distribution measuring apparatus. The results are shown in Table 7. The resultant oil-in-water emulsion of trimethyloipropane triacrylate having ethyl acetate undistilled is referred to as "oil-in-water emulsion C".

<Preparation of Oil-in-Water Emulsion D>

Next, 2 parts of an organoboron salt represented by BC-7 as a photopolymerization initiator, 1.5 part of a trihaloalkyl-substituted compound represented by T-8, and 0.6 part of the cyanine dye used in oil-in-water emulsion B were weighed, and 100 parts of ethyl acetate was added thereto to dissolve them.

Separately, 150 parts of ion-exchanged water was weighed, and 20 parts of SP-2 as a water-soluble polymer having a sulfonate group was added to and dissolved in the ion-exchanged water. As shown in Table 7, in Example 13, 3 parts of EP-1, which is a polymer compound having repeating units each represented by the general formula 1, was added to and dissolved in the resultant solution, and, in Example 14, 3 parts of EP-1 and 5 parts of PELEX OT-P were added to and dissolved in the solution. A mixture of the ethyl acetate solution and the aqueous solution was dispersed by the same method as that for oil-in-water emulsion C. The resultant oil-in-water emulsion of the photopolymerization initiator and sensitizing dye having ethyl acetate undistilled is referred to as "oil-in-water emulsion D".

<Preparation of Oil-in-Water Emulsion E>

Further, oil-in-water emulsion C and oil-in-water emulsion D were mixed together, and then introduced into the above-mentioned vacuum emulsifying apparatus, and a reduced pressure state was created in the apparatus using an aspirator, and the temperature in the apparatus was increased to 50° C. under conditions at a reduced pressure corresponding to 20% of atmospheric pressure to distill off ethyl acetate under a reduced pressure. The amount of the ethyl acetate recovered by a condenser confirmed that all the ethyl acetate used was distilled off from the oil-in-water emulsion. The resultant distilled mixture of oil-in-water emulsion C and oil-in-water emulsion D is referred to as "oil-in-water emulsion E".

<Preparation of a Photosensitive Composition>

In Examples 7 to 12 and Comparative Examples 7 and 8, 150 parts of the above-obtained oil-in-water emulsion A having distilled off ethyl acetate and 150 parts of the above-obtained oil-in-water emulsion B having distilled off ethyl acetate were mixed together, and further a coloring agent was added to the resultant mixture, and, in Examples 13 and 14, a coloring agent was added to oil-in-water emulsion E to prepare a photosensitive composition, and the prepared composition as such was used as a coating fluid for producing a photosensitive lithographic printing plate material. As a coloring agent, Himicron K Blue 7361 was used, and 10 parts of the coloring agent was added relative to the whole amount of the oil-in-water emulsion obtained in each of Examples and Comparative Examples, and the resultant mixture was stirred to prepare a blue coating fluid having the coloring agent uniformly dispersed therein. With respect to the prepared coating fluid, the coating fluid obtained immediately after the preparation and the coating fluid obtained after allowed to stand in an environment at 25° C. for three days were individually used in the preparation of a photosensitive lithographic printing plate material shown below.

<Preparation of a Photosensitive Lithographic Printing Plate Material>

A hydrophilic layer coating fluid having the formulation for hydrophilic layer shown below was prepared and applied onto a polyester film having a thickness of 100 μm using a wire bar so that the dry coating weight became 2.0 g/m$^2$, and dried in a dryer at 60° C. for 3 minutes, and further the dried material was heated in a dryer at 40° C. for two days to obtain a substrate having a hydrophilic layer.

| <Formulation for hydrophilic layer> | |
|---|---|
| Colloidal silica dispersion SNOWTEX S (manufactured by Nissan Chemical Industries, Ltd.) | 1.5 Part by mass |
| Water-soluble polymer shown below (molecular weight: 200,000) | 1 Part by mass |
| Crosslinking agent shown below | 0.3 Part by mass |
| pH Adjustor (pH adjusted to 5.0 using an aqueous sodium hydroxide solution or aqueous sulfuric acid solution) | |
| Ion-exchanged water | 20 Parts by mass |

[Chemical formula 17]
Water-soluble polymer $\left(\text{CH}_2\text{-CH}\right)_{70}\left(\text{CH}_2\text{-CH}\right)_{30}$
        |                      |
     C=O                    C=O
        |                      |
      NH$_2$                  OH Crosslinking agent CH$_2$—CH—CH$_2$—O—(CH$_2$—CH$_2$—O)$_n$—CH$_2$—CH—CH$_2$
    \O/                                              \O/ n = 1~2

The above-obtained coating fluid of the photosensitive composition was applied onto the hydrophilic layer on the substrate having the hydrophilic layer using a wire bar, and dried to form a photo-curable photosensitive layer. The dry coating weight of the photo-curable photosensitive layer was 1.6 g/m$^2$. The drying was made by heating in a dryer at 80° C. for 10 minutes.

Further, a protective layer coating fluid having the formulation for protective layer shown below was prepared and applied onto each photo-curable photosensitive layer so that the dry thickness became 1.5 μm, and dried in a dryer at 75° C. for 10 minutes to obtain photosensitive lithographic printing plate materials in Examples 7 to 14 and Comparative Examples 7 to 9.

| <Formulation for protective layer> | |
|---|---|
| Polyvinyl alcohol PVA-102 (manufactured by Kuraray Co., Ltd.) | 1 Part by mass |
| Ion-exchanged water | 9 Parts by mass |

<Plate Making from the Photosensitive Lithographic Printing Plate Material and Evaluation>

With respect to each of the above-obtained photosensitive lithographic printing plate materials, on the day when each material was applied, a solid image was made using as an exposure apparatus a bluish violet semiconductor laser (output: 50 mW) emitted at 405 nm under conditions such that the plate surface exposure energy was set at 100 μJ/cm$^2$, 200 μJ/cm$^2$, or 400 μJ/cm$^2$. The resultant photosensitive lithographic printing plate having a solid image made was developed by dipping it in ion-exchanged water at 25° C. for 15 seconds and rubbing a cellulose sponge against the surface of the plate on the photo-curable photosensitive layer side, and dried. With respect to the photosensitive lithographic printing plate material obtained after the plate making, a reflection density of the solid image portion was measured using DM-620 (manufactured by Dainippon Screen Mfg. Co., Ltd.), and evaluated in accordance with the following criteria: "○" indicates 80% or more of the reflection density before the development; "Δ" indicates 50 to less than 80% of the reflection density before the development; and "x" indicates less than 50% of the reflection density before the development. The results are shown in Table 8.

TABLE 8

| | Plate surface exposure energy | | |
|---|---|---|---|
| | 100 μJ/cm$^2$ | 200 μJ/cm$^2$ | 400 μJ/cm$^2$ |
| Immediately after preparation of coating fluid | | | |
| Example 7 | ○ | ○ | ○ |
| Example 8 | ○ | ○ | ○ |
| Example 9 | ○ | ○ | ○ |
| Example 10 | ○ | ○ | ○ |
| Example 11 | ○ | ○ | ○ |
| Example 12 | ○ | ○ | ○ |
| Example 13 | ○ | ○ | ○ |
| Example 14 | ○ | ○ | ○ |
| Comparative Example 7 | x | ○ | ○ |
| Comparative Example 8 | x | ○ | ○ |
| After 3 days at 25° C. | | | |
| Example 7 | ○ | ○ | ○ |
| Example 8 | Δ | ○ | ○ |
| Example 9 | ○ | ○ | ○ |
| Example 10 | ○ | ○ | ○ |
| Example 11 | Δ | ○ | ○ |
| Example 12 | Δ | ○ | ○ |
| Example 13 | ○ | ○ | ○ |
| Example 14 | ○ | ○ | ○ |
| Comparative Example 7 | x | x | Δ |
| Comparative Example 8 | x | x | Δ |

The photosensitive composition containing an aqueous dispersion of the present invention had excellent storage stability (pot life), and, by using the photosensitive composition, a photosensitive lithographic printing plate material having high sensitivity was obtained.

INDUSTRIAL APPLICABILITY

There is provided a photosensitive composition which can be advantageously used in a photosensitive lithographic printing plate material capable of being developed using water, resists for printed wiring board fabrication, color filters, the formation of fluorescent patterns, and photo-curable or ionizing radiation-curable inks for various printing methods and for ink-jet recording.

The invention claimed is:

1. A photosensitive composition containing at least an aqueous dispersion comprising
an oil-in-water emulsion of a photopolymerization initiator and
an oil-in-water emulsion of a compound having a polymerizable double bond group,
at least one of the oil-in-water emulsion of the photopolymerization initiator and the oil-in-water emulsion of the compound having a polymerizable double bond group being an oil-in-water emulsion obtained by emulsifying and dispersing the photopolymerization initiator or the compound having a polymerizable double bond group in water in the presence of a water-soluble polymer having a sulfonate group and an anionic surfactant, wherein said anionic surfactant is at least one member selected from the group consisting of dioctyl sodium sulfosuccinate, an alkylnaphthalenesulfonate, and a polyethylene oxide adduct of an alkyl ether sulfate.

2. The photosensitive composition according to claim 1, wherein the oil-in-water emulsion of the photopolymerization initiator is an oil-in-water emulsion obtained by emulsifying and dispersing the photopolymerization initiator in water in the presence of a water-soluble polymer having a sulfonate group and an anionic surfactant, and wherein the oil-in-water emulsion of the compound having a polymerizable double bond group is an oil-in-water emulsion obtained by emulsifying and dispersing the compound having a polymerizable double bond group in water in the presence of a water-soluble polymer having a sulfonate group and an anionic surfactant.

3. The photosensitive composition according to claim 1, wherein the oil-in-water emulsion of the photopolymerization initiator or the oil-in-water emulsion of the compound having a polymerizable double bond group is an oil-in-water emulsion obtained by emulsifying and dispersing the photopolymerization initiator or the compound having a polymerizable double bond group in water in the presence of a water-soluble polymer having a sulfonate group and an anionic surfactant as well as a polymer compound having repeating units each represented by the following general formula 1:

[Chemical formula 1]

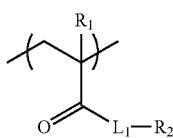

General formula 1 wherein, in general formula 1, $R_1$ represents a hydrogen atom or a methyl group, $L_1$ represents a linking group comprising an atom selected from the group consisting of a carbon atom, a hydrogen atom, an oxygen atom, a nitrogen atom, and a sulfur atom, and $R_2$ represents a substituent comprising repeating units selected from ethylene oxide and propylene oxide.

4. The photosensitive composition according to claim 1, wherein the oil-in-water emulsion of the photopolymerization initiator or the oil-in-water emulsion of the compound having a polymerizable double bond group is an oil-in-water emulsion obtained by dissolving the photopolymerization initiator or the compound having a polymerizable double bond group in a volatile organic solvent and then emulsifying and dispersing the resultant solution in water, and subsequently distilling off the volatile organic solvent.

5. The photosensitive composition according to claim 4, wherein the volatile organic solvent is ethyl acetate.

6. The photosensitive composition according to claim 1, wherein the photopolymerization initiator is an organoboron salt.

7. The photosensitive composition according to claim 1, wherein the photopolymerization initiator is a trihaloalkyl-substituted compound.

8. The photosensitive composition according to claim 1, wherein the photopolymerization initiator is an organoboron salt and a trihaloalkyl-substituted compound.

9. The photosensitive composition according to claim 1, wherein the water-soluble polymer having a sulfonate group is a polymer having a polymerizable double bond group on the side chain thereof.

10. The photosensitive composition according to claim 1, wherein the anionic surfactant is dioctyl sodium sulfosuccinate.

11. The photosensitive composition according to claim 3, wherein, in the polymer compound having repeating units each represented by the general formula 1, the number of the repeating units in the substituent represented by $R_2$ comprising repeating units selected from ethylene oxide and propylene oxide is 5 to 80, and the proportion of the ethylene oxide to the sum of the ethylene oxide and propylene oxide repeating units is 60% or more.

12. A photosensitive lithographic printing plate material having on a substrate a photo-curable photosensitive layer formed by applying a coating fluid containing the photosensitive composition according claim 1 onto the substrate.

13. A photosensitive composition containing at least an aqueous dispersion comprising an oil-in-water emulsion of a photopolymerization initiator and an oil-in-water emulsion of a compound having a polymerizable double bond group, at least one of the oil-in-water emulsion of the photopolymerization initiator and the oil-in-water emulsion of the compound having a polymerizable double bond group being an oil-in-water emulsion obtained by emulsifying and dispersing the photopolymerization initiator or the compound having a polymerizable double bond group in water in the presence of a water-soluble polymer having a sulfonate group and a polymer compound having repeating units each represented by the following general formula 1:

[Chemical formula 1]

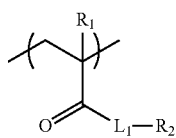

General formula 1 wherein, in general formula 1, $R_1$ represents a hydrogen atom or a methyl group, $L_1$ represents a linking group comprising an atom selected from the group consisting of a carbon atom, a hydrogen atom, an oxygen atom, a nitrogen atom, and a sulfur atom, and $R_2$ represents a substituent comprising repeating units selected from ethylene oxide and propylene oxide.

14. The photosensitive composition according to claim 13, wherein, in the polymer compound having repeating units each represented by the general formula 1, the number of the repeating units in the substituent represented by $R_2$ comprising repeating units selected from ethylene oxide and propylene oxide is 5 to 80, and the proportion of the ethylene oxide to the sum of the ethylene oxide and propylene oxide repeating units is 60% or more.

* * * * *